United States Patent [19]
Inuzuka et al.

[11] Patent Number: 5,629,534
[45] Date of Patent: May 13, 1997

[54] SEMICONDUCTOR DEVICE

[75] Inventors: Hajime Inuzuka, Nishio; Naomi Awano, Nagoya; Takeshi Hasegawa, Nagoya; Masahito Mizukoshi, Nagoya, all of Japan

[73] Assignee: Nippondenso Co., Ltd., Kariya, Japan

[21] Appl. No.: 691,416

[22] Filed: Aug. 2, 1996

Related U.S. Application Data

[63] Continuation of Ser. No. 408,725, Mar. 22, 1995, abandoned.

[30] Foreign Application Priority Data

| Mar. 23, 1994 | [JP] | Japan | 6-079858 |
| Oct. 12, 1994 | [JP] | Japan | 6-274475 |

[51] Int. Cl.⁶ .................................. H01L 31/12
[52] U.S. Cl. .................. 257/84; 257/85; 257/524
[58] Field of Search ................. 257/84, 85, 524

[56] References Cited

U.S. PATENT DOCUMENTS 3,914,137  10/1975  Huffman et al. ............... 257/84

FOREIGN PATENT DOCUMENTS

| 49-69095 | 7/1974 | Japan . |
| 52-78392 | 7/1977 | Japan . |
| 54-66788 | 5/1979 | Japan . |
| 58-168284 | 10/1983 | Japan . |
| 60-68678 | 4/1985 | Japan . |
| 60-83383 | 5/1985 | Japan . |

*Primary Examiner*—Jerome Jackson
*Assistant Examiner*—John Guay
*Attorney, Agent, or Firm*—Cushman, Darby & Cushman IP Group of Pillsbury Madison & Sutro LLP

[57] ABSTRACT

There is provided a monolithic photocoupler which is easy to integrate. An SOI structure is formed by providing a first insulation layer on a silicon substrate. The semiconductor single crystal region is further divided by trench insulation layers into separate regions. Light emitting elements are formed on one of the separated semiconductor single crystal region and light receiving elements are formed on the other semiconductor single crystal region. The light emitting elements are obtained by forming light emitting diodes made of GaAs or the like on the substrate using a heterogeneous growth process. An optical waveguide made of a material which is optically transparent and electrically insulative such as a $TiO_2$ film on each pair of light emitting and light receiving elements. The insulation layers constituted by $SiO_2$ layers have a refractive index smaller that of the active layer of the substrate. Thus, the light emitted by the light emitting elements is almost entirely reflected without leaking out, and the light which has entered the optical waveguides reaches the light receiving elements without leaking out except those components which have entered perpendicularly or at an angle close thereto.

15 Claims, 14 Drawing Sheets

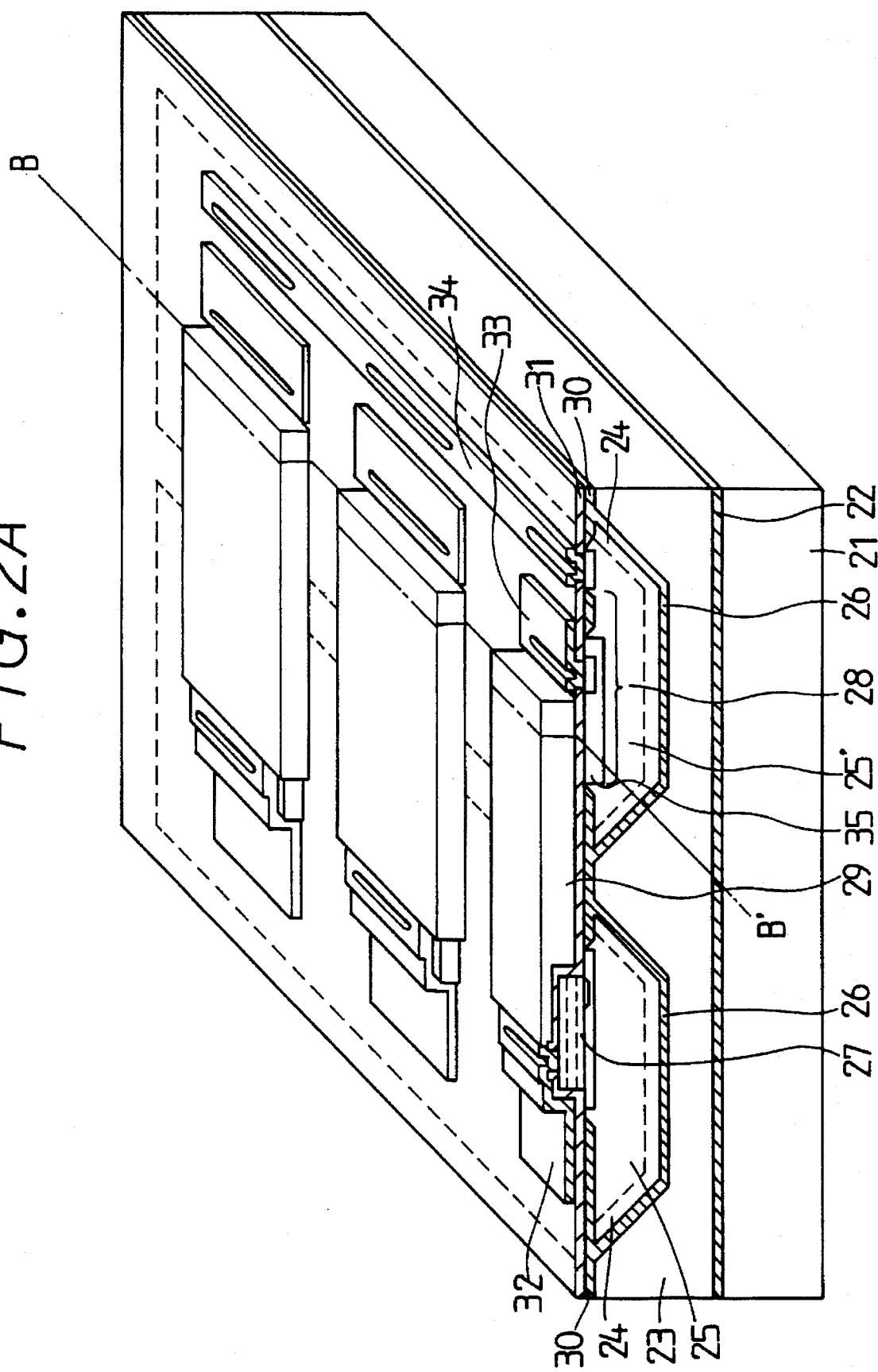

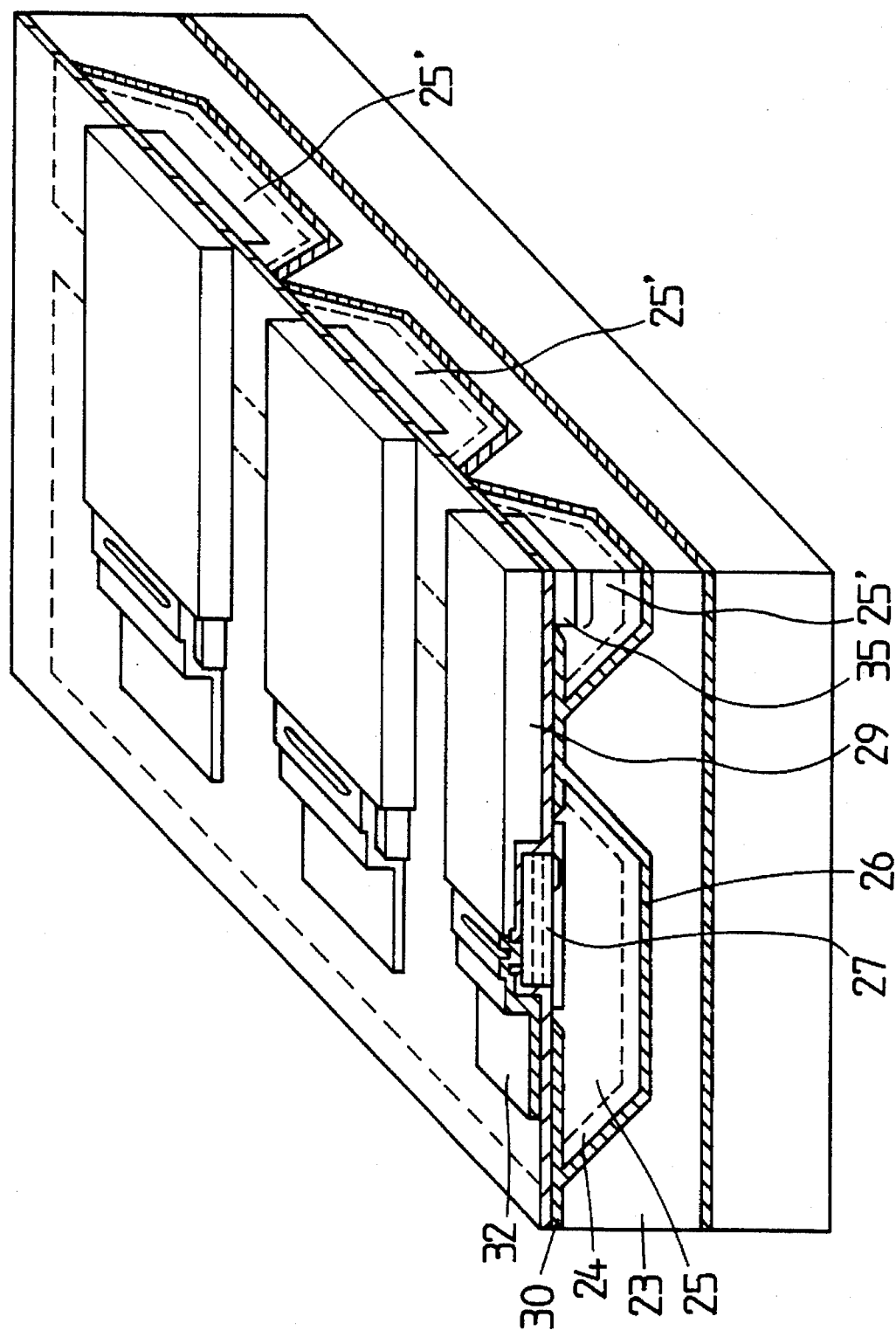

SEMICONDUCTOR DEVICE

This is a continuation of application Ser. No. 08/408,725, filed on 22 Mar. 1995, which was abandoned upon the filing hereof.

CROSS REFERENCE TO RELATED APPLICATION

This application is based upon and claims the benefit of priority of the prior Japanese Patent applications No. 6-79858 filed on Mar. 23, 1994 and No. 6-274475 filed on Oct. 12, 1994, the contents of which are incorporated herein by reference.

BACKGROUND OF THE INVENTION

1. Field of the Invention

The present invention relates to semiconductor devices having a light emitting element and a light receiving element and, more particularly, to a semiconductor device having a monolithic structure which is an integrated circuit comprising a photo-coupler or photoelectromotive force element.

2. Related Arts

It has recently become popular to provide electrical insulation using a photocoupler as a technique for isolating I/O interface portions and power supply portions of various electronic apparatuses (for example, refer to pp. 63–74 of "How to Use Opto-Electronic Devices" published by Daily Industrial News). For programmable controllers for factory automation, a number of photocouplers are used for purposes including parallel transmission of data of 16 to 64 bits and transmission of information such as abnormalities at the actuating end and the like to the controlled end. Such a photocoupler is a hybrid IC which is obtained by integrating a chip of a light emitting element utilizing a compound semiconductor such as GaAs and a chip of a light receiving element utilizing Si into a single package. A great number of such photocouplers are arranged on a substrate to be used. Japanese unexamined patent publication No. (SHO) 48-46278 corresponding to U.S. Pat. No. 3,914,137 to Huffman et al. discloses a conventional technique for integrating such photocouplers on a single chip to be more compact as a whole.

However, when this technique is used for forming a plurality of pairs of light emitting and receiving elements (channels) on the same substrate, a problem arises in that crosstalk occurs between optical signals over different channels. The term "crosstalk" used herein refers to a phenomenon that optical signals leak to and propagate in adjoining elements. The photocoupler disclosed in Japanese unexamined patent publication No. (SHO) 48-46278 uses a GaAs light emitting diode formed on the surface of a silicon substrate as a light emitting element. Since the refractive indices of Si and GaAs against light having a wavelength of about 1 μm are substantially equal to each other, i.e., they are both on the order of 3.5, the light emitted by the GaAs light emitting diode enters not only the waveguide but also the silicon substrate. The light propagates to the light receiving elements of the adjoining channels and optical waveguides, causing crosstalk between optical signals. As a result, the signals cannot be transmitted properly.

SUMMARY OF THE INVENTION

It is therefore an object of the present invention to provide a semiconductor device comprising a plurality of pairs of light emitting and receiving elements (channels) formed in a monolithic structure, wherein the occurrence of crosstalk between adjoining channels can be avoided.

In order to solve the above-described problem, according to the present invention, there is provided a configuration including: a substrate; a semiconductor single crystal region constituted by a single crystal semiconductor formed on the substrate; a plurality of channels, each constituted by a light emitting element, formed on the semiconductor single crystal region, for emitting light in response to an input electrical signal, a light receiving element, formed on the semiconductor single crystal region, for receiving the light emitted by the light emitting element and for outputting an output electrical signal, and an optical waveguide, formed across the light emitting element and the light receiving element, for optically coupling the light emitting element and the light receiving element; an electrical isolation means, formed at least between the light emitting element and the light receiving element in the channels of the semiconductor single crystal region, for electrically isolating the light emitting element and the light receiving element in each of the channels; and a crosstalk preventing means, formed between the plurality of channels of the semiconductor single crystal region, for preventing crosstalk between the channels.

According to the present invention having the configurations as described above, a plurality of channels are formed in a semiconductor single crystal region, each channel comprising a light emitting element, light receiving element, and an optical waveguide for optically coupling the light emitting and receiving elements. In such a device, when an input electrical signal is input to one of the light emitting elements, the light emitting element emits light in response to this signal. The emitted light is propagated through the associated channel and is input to the light receiving element of the same channel. The light receiving element converts the received light into an output electrical signal and outputs it.

When a plurality of channels are formed in the same semiconductor single crystal region, a part of the light emitted by the light emitting element of a channel can be propagated through the semiconductor single crystal region to the adjacent light receiving element of an adjacent channel. This can result in the so-called crosstalk which causes malfunction. According to the present invention, however, crosstalk preventing means is provided between the channels to reflect or absorb the light directed to the adjacent channel. As a result, there will be substantially no propagation of light between adjoining channels, and this makes it possible to prevent crosstalk.

The crosstalk preventing means may preferably be a light reflecting layer having a refractive index smaller than that of the semiconductor single crystal region formed between the plurality of channels of the semiconductor single crystal region.

In general, when a beam of light from a material having a high refractive index enters a material having a lower refractive index, the light is subjected to total reflection if the incident angle exceeds a critical angle. Therefore, if the crosstalk preventing means is constituted by a light reflecting layer whose refractive index is smaller than that of the semiconductor single crystal region, among beams of light which are emitted from the semiconductor single crystal region and are incident upon the crosstalk preventing means, beams of light exceeding the critical angle are subjected to total reflection. Further, even beams of light whose incident angles are smaller than the critical angle are attenuated as they pass through the light reflecting layer. As a result, crosstalk between adjoining channels can be avoided.

The electrical isolation means may preferably be comprised of a first electrical isolation film constituted by an insulation film or dielectric film formed between the light emitting element and the light receiving element of each of the channels of the semiconductor single crystal region and a second electrical isolation film constituted by an insulation film or dielectric film formed between the substrate and the semiconductor single crystal region. The first electrical isolation film may be formed so as to extend from the surface of the semiconductor single crystal region up to the second electrical isolation film. In addition, electrical isolation may be provided by partially or entirely overlapping the first and second electrical isolation films into a structure having two or more layers. In this arrangement, since the light emitting and light receiving elements can be surrounded by the first and second electrical isolation films constituted by an insulation layer or dielectric, those elements can be electrically insulated.

Further, the semiconductor single crystal region can be constituted by a light emitting element area in which the light emitting elements of the channels are formed and a light receiving element area in which the light receiving elements of the channels are formed; the electrical isolation means may comprise an electrical isolation film constituted by an insulation film or dielectric film formed to surround each of the light emitting element area and the light receiving element area and a filler area having a thermal expansion coefficient close to or substantially the same as that of the semiconductor single crystal region which fills the gap between the electrical isolation films to serve as a part of the substrate. This also ensures electrical insulation between the elements. In addition, electrical isolation may be provided by partially or entirely overlapping the electrical isolation films into a structure having two or more layers.

The light reflecting layer as the crosstalk preventing means may also serve as the electrical isolation films. The optical waveguide may be made of a transparent material having a refractive index greater than one against the wavelength of the light emitted by the light emitting elements. By means of this, even if a transparent material is used, light from the light emitting element can reach the light receiving element without leakage.

As described above, according to the present invention, it is possible to provide a semiconductor device having a monolithic structure wherein a plurality of pairs of light emitting and receiving elements (channels) can be formed so that no crosstalk occurs between adjoining channels.

In summary, the present invention comprises a substrate, a semiconductor single substrate region, channels constituted by light emitting elements, light receiving elements and optical waveguides, an electrical isolation means, and a crosstalk preventing means. This configuration is easy to integrate and does not affect elements in other regions on the semiconductor device. The present invention makes it possible to configure multi-channel bidirectional photocouplers which can be easily integrated and can be also used for parallel electrical insulation of multiple channels in noisy environments as experienced in applications for factory automation.

Further, since signal light can be reflected utilizing a difference between refractive indices, no light leaks out from the specified channel. It is also advantageous that such a isolated structure can be easily formed. There are further advantages in that, by providing electric isolation films of two or more layers, a plurality of the light receiving elements can be connected in series to provide a high photoelectromotive force.

Incidentally, according to the present invention, the multilayer isolation film can be formed using a small number of processing steps, and highly flexible configurations can be provided.

Specifically, the semiconductor single crystal region may be of silicon and the light emitting elements may be gallium arsenide (GaAs) light emitting diodes formed thereon through a heterojunction. In alternative, the semiconductor single crystal region may be of silicon; the light emitting elements may be any of phototransistors, photodiodes, photothyristors, photo-triacs and photoelectromotive force elements utilizing silicon (Si); and the light reflecting layer may be any of silicon oxide ($SiO_2$), silica glass, and an air gap.

Further, the optical waveguide may be of a silicon nitride ($Si_3N_4$) film, titanium oxide ($TiO_2$) film, or arsenic glass ($As_2Se_3$, $As_2S_3$); and the electrical isolation film may be made of silicon oxide ($SiO_2$) or silica glass.

BRIEF DESCRIPTION OF THE DRAWINGS

These and other objects, features and characteristics of the present invention will be appreciated from a study of the following detailed description, the appended claims, and drawings, all of which form a part of this application. In the drawings:

FIG. 2A is a schematic perspective view showing a configuration of a second embodiment of the present invention;

FIG. 2B is a schematic perspective view showing a section along he line B—B in FIG. 2A;

DETAILED DESCRIPTION OF THE PRESENTLY PREFERRED EXEMPLARY EMBODIMENTS

The present invention will now be described with reference to the specific embodiments thereof.

A first embodiment of the present invention will now be described.

Figure 1A:
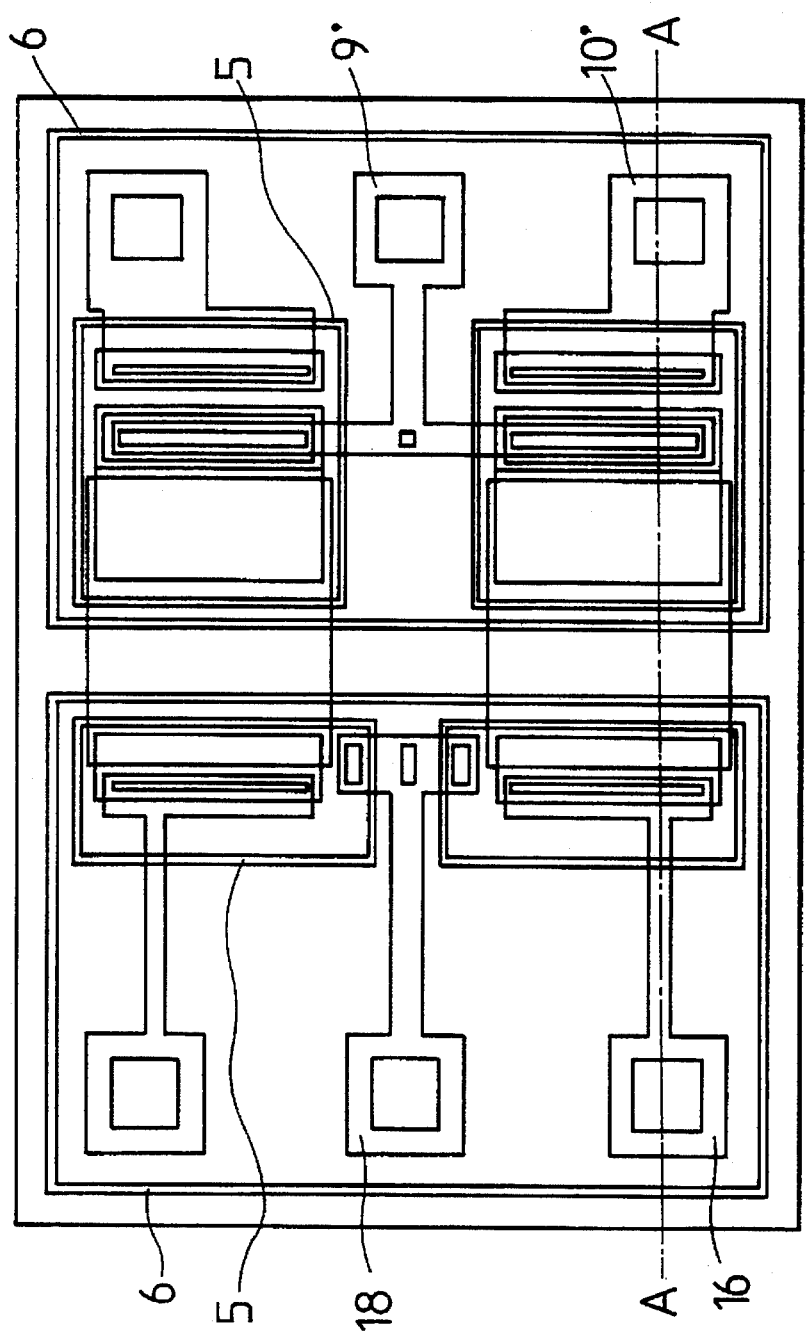
FIG. 1A is a schematic plan view showing a configuration of a first embodiment of the present invention.
Figure 1B:
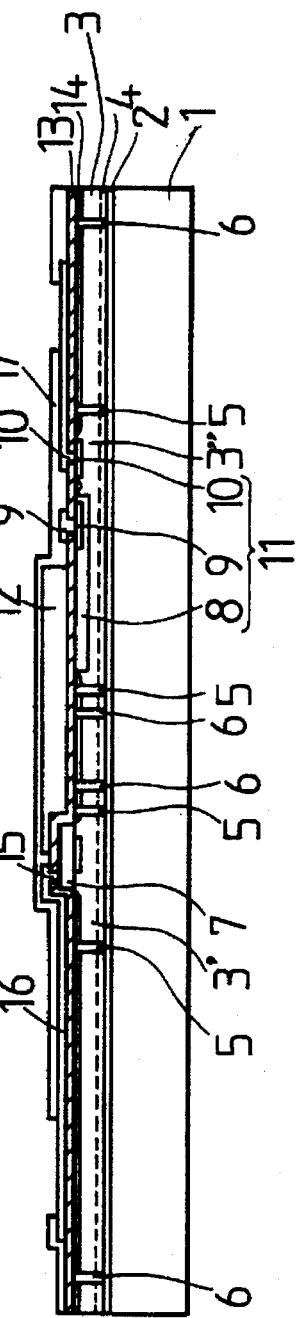
FIG. 1B is a schematic sectional view taken along the line A—A in FIG. 1A.

FIG. 1A is a schematic plan view of a multi-channel photocoupler (MPC) semiconductor device wherein two photocouplers are formed on a single silicon substrate 1, and FIG. 1B is a sectional view taken along the line A—A. Referring first to the plan view in FIG. 1A, an area surrounded by an electrical insulation layer 6 made of silicon oxide ($SiO_2$) having a trench structure is formed on the left side of a semiconductor single crystal region 3. In this area, two semiconductor single crystal regions 3' are provided and are each surrounded by a light reflecting layer 5 which is also made of silicon oxide ($SiO_2$). A GaAs light emitting diode (GaAs LED) 7 as a light emitting element is formed in each of the regions 3'. These GaAs LED's 7 are insulated from the silicon substrate 1 by an SOI structure constituted by a $SiO_2$ insulation layer 2 formed in the substrate 1. In order to improve the conductivity of the semiconductor single crystal regions 3 and 3', a high density diffusion layer 4 is formed adjacent to the $SiO_2$ insulation layer 2 in the substrate. A common primary ground electrode 18 is led out from the GaAs LED's 7, the electrode being connected to the regions 3' surrounded by the light reflecting layers 5. A current injection electrode 16 is led out from each of the LED's 7, and a contact portion is formed on the electrode for bonding it in the area surrounded by the electrical insulation layer 6. These electrodes are insulated from the semiconductor single crystal layer 3 by a LOCOS insulation film 14 and a $Si_3N_4$ insulation layer 13 on the surface of the layer. The LOCOS insulation film is referred to as a light reflecting layer 14.

On the right side of the semiconductor single crystal region 3 shown in FIG. 1A, an area is also formed which is surrounded by an electrical insulation layer 6 made of silicon oxide ($SiO_2$). This area also has two semiconductor single crystal regions 3" which are each surrounded by a light reflecting layer 5 made of silicon oxide ($SiO_2$). In each of the regions 3", there is formed a phototransistor 11. Emitter electrodes 9 of the phototransistors are connected together and lead out a secondary common ground. A collector electrode 10 is led out from each of the phototransistors, and a contact portion is formed in a area surrounded by the electrical insulation layer 6. Of course, there electrodes are similarly isolated by the LOCOS insulation film 14 and $Si_3N_4$ insulation layer 13 on the surface of the layer.

An optical waveguide 12 made of titanium oxide ($TiO_2$) is formed across the areas of each pair of the GaAs LED 7 and phototransistor 11 to constitute a channel comprising a pair of LED and phototransistor (photocoupler). This optical waveguide 12 extends across the light emitting portion of a GaAs LED 7 and the area of a phototransistor 11 serving as the base. The light from GaAs LED 7 is propagated though the optical waveguide 12 and is introduced into the base 8 of the phototransistor. The optical waveguide 12 is configured to contact the base 8 in a larger area from the viewpoint of the efficiency of signal transfer. Further, a surface protective film 17 is formed on the optical waveguide 12, which covers other areas as well. The optical waveguide may be made of gallium glass ($As_2Se_3$, $As_2S_3$, etc.) or silicon nitride ($Si_3N_4$).

Since the GaAs LED 7 is made of GaAs, it has a lattice constant which is different from that of the silicon of the substrate. It is therefore not possible to simply grow a GaAs crystal on the substrate. Then, a layer of p- or n-type GaAs is formed depending on the conductivity type of the substrate using a heterojunction technique to provide an ohmic junction, and a p-n junction structure is obtained by laminating p-GaAs and n-GaAs layers in the GaAs layer.

Figure 7:
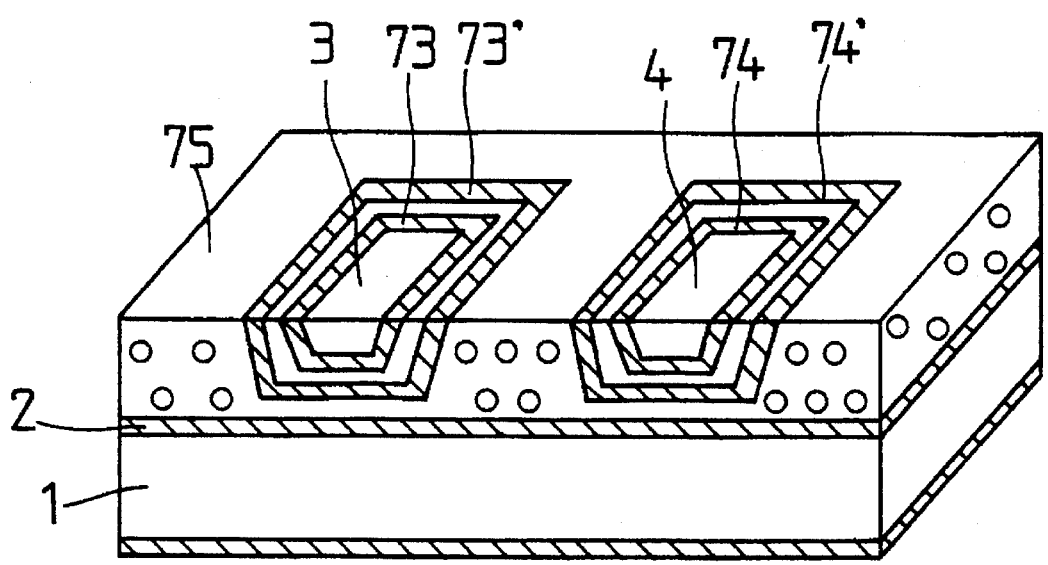
FIG. 7 is a schematic perspective view showing a configuration of an isolation layer according to a sixth embodiment of the present invention.

Referring to the sectional view in FIG. 1B taken along the line A—A in FIG. 7, although not shown in detail, the GaAs LED 7 is obtained by forming an active region on the semiconductor single crystal region 3' surrounded by the light reflecting layer 5 and by jointing the GaAs layer thereon on a heterogeneous basis. If the semiconductor single crystal region 3 is an n-Si active layer, an island which is a p-Si active region is formed in the area in which the junction is formed. Further, an island which is an $n^+$-Si active layer region is formed therein, and an n-GaAs layer is jointed to cover this portion on a heterogeneous basis. A p-GaAs layer is formed thereon to provide a p-n junction.

A silicon nitride ($Si_3N_4$) 13 serving as an intermediate protective layer is formed above the p-GaAs layer, and a contact hole 15 for the current injection electrode is formed in a part of the film 13. A gold-zinc alloy layer which is an ohmic contact material for p-GaAs is formed in this hole, and an aluminum electrode 16 serving as the current injection electrode is patterned above this layer. As shown in FIG. 1A, the primary ground electrode 18 has a contact hole which is connected to both of the semiconductor single crystal regions 3' of the two GaAs LED's 7 and also has a contact in the area surrounded by the electrical insulation layer 6 to provide this area with the same electrical potential. With this arrangement, the GaAs LED's 7 can be caused to emit light by biasing the current injection electrodes 16 toward the positive side and the primary ground electrode 18 toward the negative side.

This p-n junction is energized to cause the emission of light from the plane of the junction. When a positive (+) potential and a negative (−) potential are applied to the current injection electrode 16 of the GaAs LED 7 and the primary ground electrode 18, respectively, holes and electrons are injected and are recombined at the junction between the p-GaAs layer and n-GaAs layer (not shown). As a result, light (infrared ray) having a wavelength of 0.9–1 µm is emitted from the junction. Since the current injection electrode 16 is led out at a part of the upper surface of the GaAs layer, an arrangement is made so that the rest of the upper surface is covered by the optical waveguide 12.

Titanium oxide ($TiO_2$) that constitutes the optical waveguide 12 has a refractive index of 2.5–2.8 while the refractive index of GaAs is 3.5. Thus, about half of the light from the GaAs LED 7 that have reached the interface to the $TiO_2$ optical waveguide 12 is propagated into the $TiO_2$ optical waveguide 12.

As shown in FIG. 1B, the silicon phototransistor 11 has a region surrounded by the light reflecting layer 5 formed of silicon oxide ($SiO_2$) which serves as the collector region 3". An island 8 is formed in the collector region 3" as a base region, and an island 9 as an emitter region is formed in a part of the of the base region 8. These regions are covered by the $Si_3N_4$ insulation layer 13 as a whole, and contact holes are formed in the emitter 9 and collector 10 to lead out an emitter electrode 9' and a collector electrode 10'.

Since there is no need for providing the base region 8 with an electrical contact, no hole is formed in the transparent insulation film 13 and the optical waveguide 12 is formed directly on the insulation layer 13. The reason is that the $Si_3N_4$ insulation layer 13 has substantially the same refractive index as that of the optical waveguide 12 and substantially does not reflect light having a wavelength of about 1 µm. As a result, the light having a wavelength of about 1 µm which has been introduced into the base region 8 generates electron-hole pairs in the area of the junction between the base and collector, i.e., performs carrier injection, thereby causing the operation of a transistor Since this $Si_3N_4$ insulation layer 13 transmits the light from the optical waveguide 12, the light reflecting layer 14 for preventing the leakage of the light is provided under the insulation layer 13 to guide the light emitted by the GaAs LED 7 to the base region 8. The light reflecting layer 14 is a silicon oxide ($SiO_2$) layer formed on the surface of the semiconductor single crystal region 3 which is the so-called LOCOS oxide film. Therefore, this layer is formed not only under the optical waveguide 12 but throughout the substrate so that it covers the entire substrate except the areas of required openings.

In order to solve the problem of crosstalk that occurs when two adjoining photocouplers (channels) are formed close to each other, according to the present invention, there is provided a means for preventing crosstalk of optical signals between adjoining channels. The prevention of crosstalk is normally carried out, for example, by providing a light reflecting layer or a light absorbing member. In this first embodiment, it is accomplished by forming the light reflecting layer 5 having a trench structure. The light reflecting layer 5 is obtained by forming a trench using a trench forming technique and by forming a $SiO_2$ film on the sidewall inside the trench. Therefore, it can be formed simultaneously with the $SiO_2$ insulation layer 6 at the same process step. Further, the GaAs LED and the silicon phototransistor are isolated by the $SiO_2$ insulation layer 6 which also serves as a light reflecting layer. This means that isolation is achieved both electrically and optically.

As described above, a single crystal silicon layer insulated from the silicon substrate by an SOI (Silicon On Insulator) structure as an electrical isolation means between the light emitting and light receiving elements; a trench is formed such that the pattern of its plane extending from the surface of the single crystal silicon layer to the SOI insulation film defines a closed curve; and a $SiO_2$ insulation layer is provided on the sidewall of the trench. In this case, a trench surrounding one each light emitting and light receiving elements may be formed on the single crystal silicon layer so that it extends from the surface of the single crystal silicon layer down to a depth at which a path for crosstalk between optical signals is interrupted, and a $SiO_2$ layer may be formed on the sidewall to provide a light reflecting layer. It should be noted that the trench itself serves as a light reflecting layer even if the interior thereof is left vacant regardless of whether a $SiO_2$ layer is provided on the trench sidewall or not.

A second embodiment of the present invention will now be described.

FIG. 2A is a schematic outside view showing a configuration of a multi-channel photocoupler (MPC) as another embodiment of the present invention, with a section of one of the channels shown on the near side. According to this second embodiment, the electrical isolation means is formed during the formation of the wafer using a dielectric isolation technique. In the configuration illustrated, photocoupler channels are formed in parallel and therefore can be arranged on a semiconductor chip in a required quantity. Each channel is formed so that it extends across a plurality of silicon single crystal regions which are formed in advance when the substrate 20 is prepared. FIG. 2B is a perspective view showing a section taken along the line B–B' in FIG. 2A. As illustrated, each of the silicon single crystal regions is surrounded by a $SiO_2$ insulation layer to be electrically and optically isolated from other Si single crystal regions. Although FIG. 2B shows a sectional view of the single crystal regions wherein phototransistors 28 are formed, the single crystal regions wherein GaAs LEDs 27 are formed have a similar view.

One photocoupler channel is constituted by a GaAs LED 27, a Si phototransistor 28, and a $TiO_2$ optical waveguide 29 formed across them. A GaAs layer is jointed on a Si single crystal region 25 on a heterogeneous basis to provide a p-n junction of GaAs. The Si phototransistor 28 is formed in another Si single crystal region 25'. Then, they are connected by the $TiO_2$ optical waveguide 29.

Figure 3:
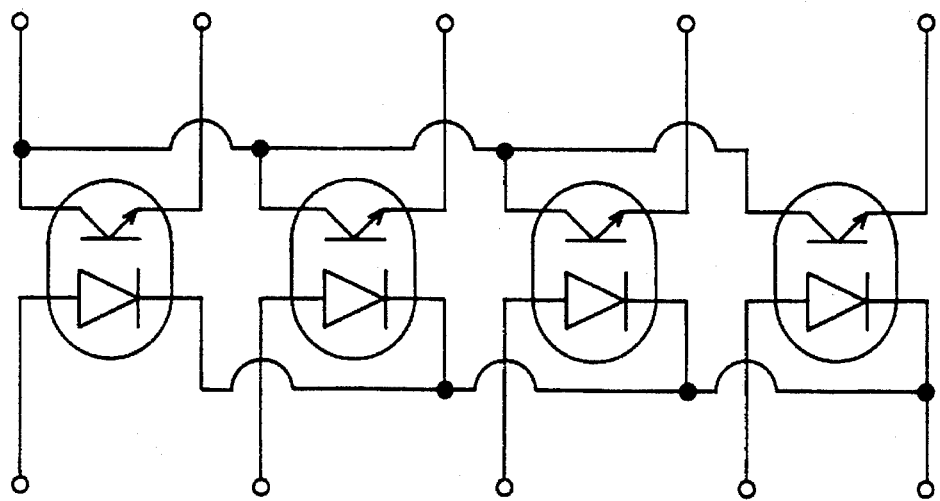
FIG. 3 is an equivalent circuit diagram for the second embodiment.

Thus, the configuration of the photocoupler is similar to that in the first embodiment in its principle and structure. The GaAs LED 27 is formed by growing an n-GaAs layer and a p-GaAs layer sequentially on the n-Si layer 25. It is possible to cause GaAs LED 27 to emit light by applying a positive voltage and a negative voltage to a current injection electrode 32 and the single crystal Si layer 25, respectively. The phototransistor 28 has a collector 34 which is another single crystal region 25 and has a base 35 and an emitter 33 formed similarly to those in the first embodiment. The collector 34 serves as a common electrode. FIG. 3 shows an equivalent circuit for such a photocoupler (four units in a parallel arrangement are shown). For simplicity in illustration, the surface protective layer is not shown in FIG. 2A and FIG. 2B.

A brief description will now be made on the steps for manufacturing this monolithic photocoupler having the dielectric isolation structure as shown in FIG. 2A and FIG. 2B.

First, the n-type single silicon substrate 20 having an impurity density of about $10^{16}$ $cm^{-3}$ is prepared. The surface of this substrate is etched to form a V-shaped groove which defines the single crystal silicon island regions 25 and 25'.

On the surface of the single crystal silicon substrate 20 having the V-shaped groove formed thereon, n-type impurities of about $10^{19}$ cm$^{-3}$ are diffused to a depth of about 1 µm using a vapor phase diffusion process to form a high density diffusion layer 24 on the surface of which a dielectric isolation film (silicon oxide (SiO$_2$) film) 26 is formed to a thickness of about 2 µm using a thermal oxidation process.

Subsequently, a polysilicon layer 23 is formed on the single crystal silicon substrate at about 1,100° C. using a normal pressure CVD process. The thickness of the polysilicon layer 23 is two to three times that of the depth of the single crystal silicon islands 25 and 25'.

Thereafter, the surface of the polysilicon layer 23 is mirror-finished by polishing.

Then, a separate mirror-finished silicon substrate 21 is prepared, and a silicon oxide layer 22 is formed on the mirror-finished surface. The surface of this silicon oxide layer 22 and the mirror-finished surface of the polysilicon layer 23 are directly joined together using a direct bonding process.

Subsequently, the rear side of the single crystal silicon substrate 20 is polished to isolate the single crystal silicon island regions 25 and 25' from each other.

The light emitting diode 27 and phototransistor 28 are formed on the single crystal silicon island regions 25 and 25', respectively, along with the light reflecting layer 30 and the intermediate insulation layer 31 constituted by a LOCOS oxide film. Then, the optical waveguide 29, current injection electrode 32, and emitter electrode 33 are formed to complete a monolithic photocoupler. Adjoining photocoupler channels are optically and electrically isolated from each other.

The configuration provided by this manufacturing method is advantageous in that the processing time is short because the electrical isolation layer 26 which is a dielectric isolation layer also serves as an optical isolation layer and the isolation structure can be formed concurrently with the formation of the wafer. In addition, since a parallel structure can be easily formed, an integrated multi-channel photocoupler can be simply formed.

A third embodiment of the present invention will now be described.

Figure 4:
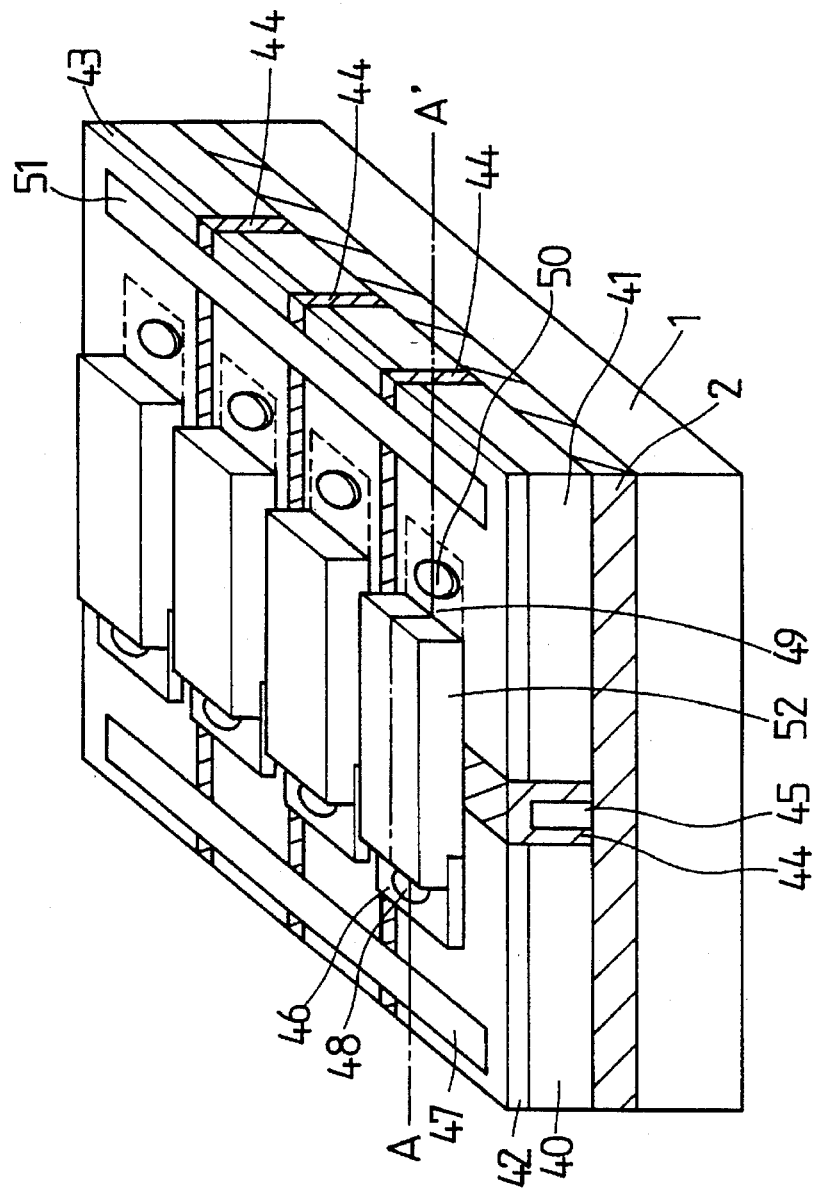
FIG. 4 i a schematic perspective view showing a configuration of a third embodiment.
Figure 5:
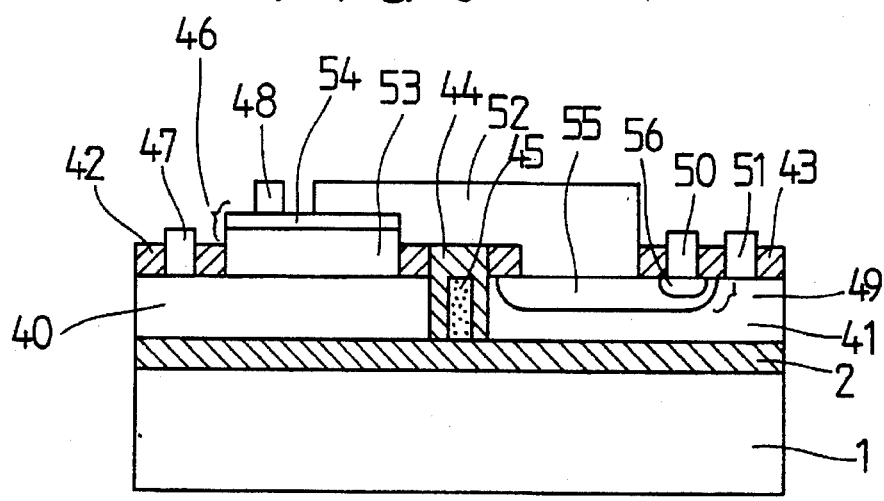
FIG. 5 is a schematic configuration diagram showing the sectional view taken along the line A—A' in FIG. 4.

FIG. 4 shows an embodiment of the present invention wherein electrical and optical isolation is carried out using SOI and trench techniques and schematically shows a basic configuration of a photocoupler integrated circuit utilizing a silicon substrate 1. The figure shows four photocouplers formed in parallel, and a schematic sectional view of one of the photocouplers taken along the line A–A' is shown in FIG. 5. This circuit constituted by four photocouplers has a configuration as shown in the equivalent circuit diagram in FIG. 3 like the second embodiment.

In the structure illustrated, two n-type single crystal Si (n-Si) layer 40 and 41 which are semiconductor single crystal regions are formed on the Si substrate 1 with a SiO$_2$ insulation layer 2 (first insulation layer) which is an insulating isolation layer interposed therebetween. SiO$_2$ insulation layers 42 and 43 are formed on surfaces of the n-Si layers 40 and 41, respectively, for protecting the interior. In order to electrically and optically isolate the n-Si layers 40 and 41, a groove portion (trench, second insulation layer) (44) is provided. An oxide film (SiO$_2$) is formed on the sidewalls of the interior of the groove portion which is filled by polysilicon 45 to prevent the formation of steps and which is enclosed by SiO$_2$. GaAs light emitting diodes 46 are formed in openings (not visible in FIG. 4) of the SiO$_2$ insulation layer 42 on a heterojunction basis using an epitaxial growth process. These light emitting diodes 46 are electrically connected to a primary ground electrode 47 formed in an opening of the SiO$_2$ insulation layer 42 through the n-Si layer 40. The primary ground electrode 47 serves as the common ground for the primary side and is formed as an elongate electrode in an opening provided on the n-Si layer 33 as shown in FIG. 4.

A current injection electrode 48 is formed on the surface of the each GaAs light emitting diode 46. Four phototransistors 49 are formed in parallel inside the n-Si layer 41. Emitter electrodes 50 and a common collector electrode 51 of the phototransistors 49 are formed in openings (not visible in FIG. 4) of the SiO$_2$ film 43 formed on the surface of the n-Si layer 41. Like the primary ground electrode 47, this common collector electrode 51 is formed as an elongate electrode in an opening provided on the SiO$_2$ insulation layer 43. A TiO$_2$ optical waveguide 52 is formed on the surfaces of each pair of the GaAs LED 46 and phototransistor 49.

FIG. 5 schematically shows a sectional structure viewed along the line A–A' in the plan view in FIG. 4. The GaAs LED 46 is formed by growing an n-GaAs layer 53 and a p-GaAs layer 54 on the n-Si layer 40 sequentially. Although not shown in detail, the junction between the n-GaAs layer 53 and the n-Si layer 40 has ohmic current-voltage characteristics. The GaAs LED 46 can be caused to emit light by applying a positive voltage and a negative voltage to the current injection electrode 48 and primary ground electrode 47, respectively.

The phototransistor 49 uses an island 55 which is a p-Si region formed by sequentially diffusing impurities serving as acceptors and donors in the n-Si layer 41 as its base, an island 56 which is an n-Si region in the island 55 as its emitter, and the SOI-isolated n-Si layer 41 as its collector 51.

The TiO$_2$ optical waveguide 52 is formed to contact both of the surface of the p-GaAs layer 54 of the GaAs LED 46 and the surface of the p-Si region 55 serving as the base of the phototransistor 49. Since these elements are different in height, a flattening technique is employed again to prevent the formation of a step which will otherwise occurs when the optical waveguide 52 is formed. The purpose is to prevent unnecessary reflections from adversely affecting signals, e.g., from reducing the transmission efficiency thereof. The TiO$_2$ optical waveguide 52 is surrounded by substances having low refractive indices such as the SiO$_2$ insulation layer and the air. So, the light transmitted from the GaAs LED 46 to the TiO$_2$ optical waveguide 52 reaches the p-Si region 55 serving as the base of the phototransistor 49 without leaking out except those components which impinge the interface perpendicularly or at an angle close to that. Since the refractive index of Si is greater than that of TiO$_2$, the light which has reached the p-Si region 55 is propagated into the phototransistor to generate electron-hole pairs at the base-collector junction, and this establishes a base current which turns the phototransistor 49 on.

When a positive (+) potential and a negative (−) potential are applied to the current injection electrode 48 of the GaAs LED 46 and the primary ground electrode 47, respectively, holes and electrons are injected and are recombined at the junction between the p-GaAs layer 54 and n-GaAs layer 53. As a result, light having a wavelength of 0.9–1 µm is emitted from the junction. Since TiO$_2$ has a refractive index of 2.5–2.8 while the refractive index of GaAs is 3.5, about half of the light from the GaAs LED 46 that have reached the interface to the TiO$_2$ optical waveguide 52 is propagated into the TiO$_2$ optical waveguide 52. On the other hand, the refractive indices of the SiO$_2$ insulation layer and the air are 1.5 and 1, respectively. Therefore, 80–90% of the light which has reached the interface between the GaAs LED 46 and the SiO$_2$ insulation layer 42 and the exposed portion of the GaAs LED 46 is reflected back into the GaAs LED 46. Since Si has a refractive index of 3.5 which is the same as that of GaAs, the light which has reached the interface to the n-Si layer 55 enters the n-Si layer 55 without being subjected to substantially no reflection.

A fourth embodiment of the present invention will now be described.

This embodiment addresses a structure which is a modification of the configuration of the insulating isolation layer on the substrate 1. The light emitting and light receiving elements may be in the same structures as in the above-described embodiments, so description and illustration will be omitted for them.

Figure 6A:
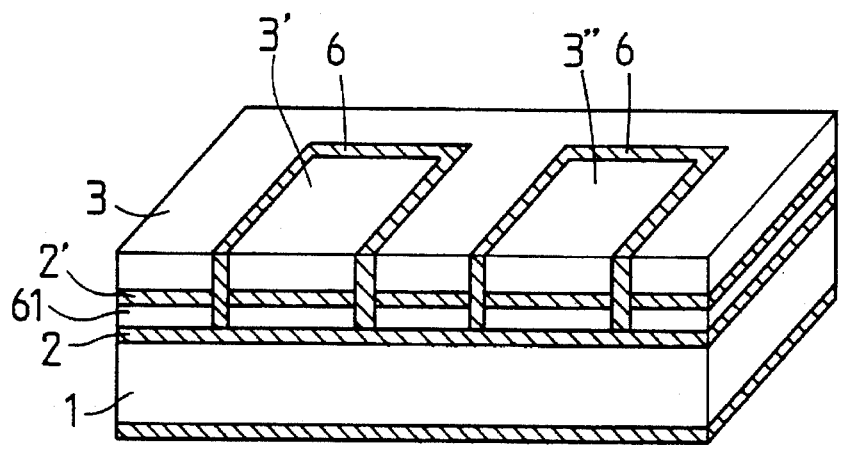
FIG. 6A is a schematic perspective view showing a configuration of an isolation layer according to a fourth embodiment of the present invention.

FIG. 6A shows a structure wherein an intermediate layer 61 made of single crystal silicon or polysilicon is provided on a lower first insulation layer 2 and an upper first insulation layer 2' is formed thereon to provide a first insulation layer having two layers. Normally, the first insulation layer 2 is formed by oxidizing the surface of the silicon wafer and by embedding the layer using a wafer direct boding process. In the case of a double structure, the lower first insulation layer 2 is provided after oxidizing the wafer surface; single crystal silicon is grown on an epitaxial basis or polysilicon is deposited thereon (intermediate layer 61); the upper first insulation layer 2' is formed after forming an oxide film on the surface of the intermediate layer; and, thereafter, wafer direct bonding is performed to complete the embedded first insulation layer having a double structure. Then, single crystal etching and oxide film etching are repeated from the surface to form a groove (trench) down to the upper surface of the lower first insulation layer 2 and, thereafter, an oxide film is grown in the groove to form a second insulation layer 6.

In such a structure, the lower side of the substrate normally has the same electrical potential. As a result, the voltage at the area between the side of the light emitting element (e.g., 3 in FIG. 6A) and the side of the light receiving element (e.g., 4 in FIG. 6A) is dispersed, and this improves withstand voltage characteristics. Normally, the formation of the oxide film in the first insulation layer takes a long time, so increasing the film thickness is not practical. Therefore, it is difficult to increase the withstand voltage by increasing the thickness of the film thickness. For the second insulation layers 40 and 41, their withstand voltage can be easily increased because it is easy to increase the width of the trench during the formation of them. In practice, however, the isolation groove is not completely filled with SiO$_2$. The trench has a structure wherein both of its walls are oxidized to form a SiO$_2$ film thereon; the interior is filled with polysilicon; and the upper surface is enclosed by a SiO$_2$ film. Therefore, the actual withstand voltage may not be determined by the width of the second insulation layers. This problem can be solved by the approach described below.

A fifth embodiment of the present invention will now be described.

Figure 6B:
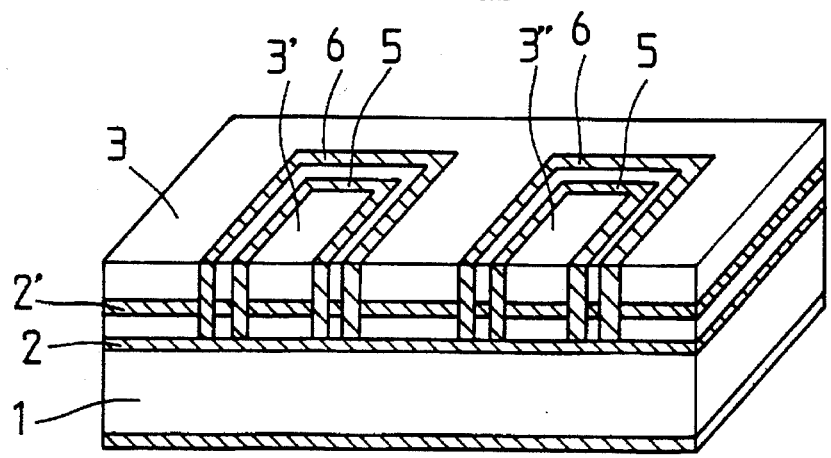
FIG. 6B is a schematic perspective view showing a configuration of an isolation layer according to a fifth embodiment of the present invention.

The withstand voltage characteristics can be sufficiently improved by combining the structure shown in FIG. 6A with the structure in the first embodiment to provide a configuration as shown in FIG. 6B wherein both of the first and second insulation layers have a double structure (indicated by 2, 2', 5, and 6 in FIG. 6B). The optimum structure may be selected from these structures depending on the required withstand voltage characteristics.

A sixth embodiment of the present invention will be described.

The configuration shown in FIG. 7 may be employed as an alternative to the second embodiment which is a configuration using an alternative wafer manufacturing technique. Although oxide films are similarly formed on the surface of a single crystal silicon wafer on which a plurality of isolation grooves (V-shaped grooves) have been formed during the formation of the wafer using the dielectric isolation process, the oxide films are formed to have a double structure in this case. Specifically, after forming first oxide films 73 and 74 on the isolation grooves, polysilicon 75 is deposited. Then, another groove is formed in each of the isolation grooves, and second oxide films 73' and 74' are formed. These double oxide films constitute an electrical isolation means which surrounds semiconductor single crystal regions to isolate them and a crosstalk preventing means. The subsequent processing steps are the same as conventional formation steps using the dielectric isolation process. Specifically, the polysilicon is sufficiently grown; the polysilicon layer 75 is flattened and combined with another single crystal silicon wafer 1 serving as the substrate (which has an oxide film 2 on the surface thereof); the wafer surface opposite to the combined surface is cut; and sharp edges of the oxide films 73, 73', 74, and 74' in the grooves which has been previously formed are cut. This leaves semiconductor single crystal regions in the area surrounded by the grooves which serve as element regions 3 and 4. Thus, semiconductor single crystal regions 3 and 4 each surrounded by a double insulation layer can be formed as shown in FIG. 7.

In such a configuration, the isolation means has a double structure constituted by the first insulation layers (73' and 74' in FIG. 7) and the second insulation layers (73 and 74 in FIG. 7) and also provides isolation from the substrate 1. This eliminates the need for considerations at the end of the substrate 1 with regard to improvement in withstand voltage characteristics. Further, the oxide films for isolation can be easily formed in a multilayer structure in the manufacturing steps. In this case, although the withstand voltage characteristics can be improved by growing the oxide films to a large thickness, the double structure is preferred because increasing the film thickness takes too much time to be practical.

A seventh embodiment of the present invention will now be described.

Figure 8:
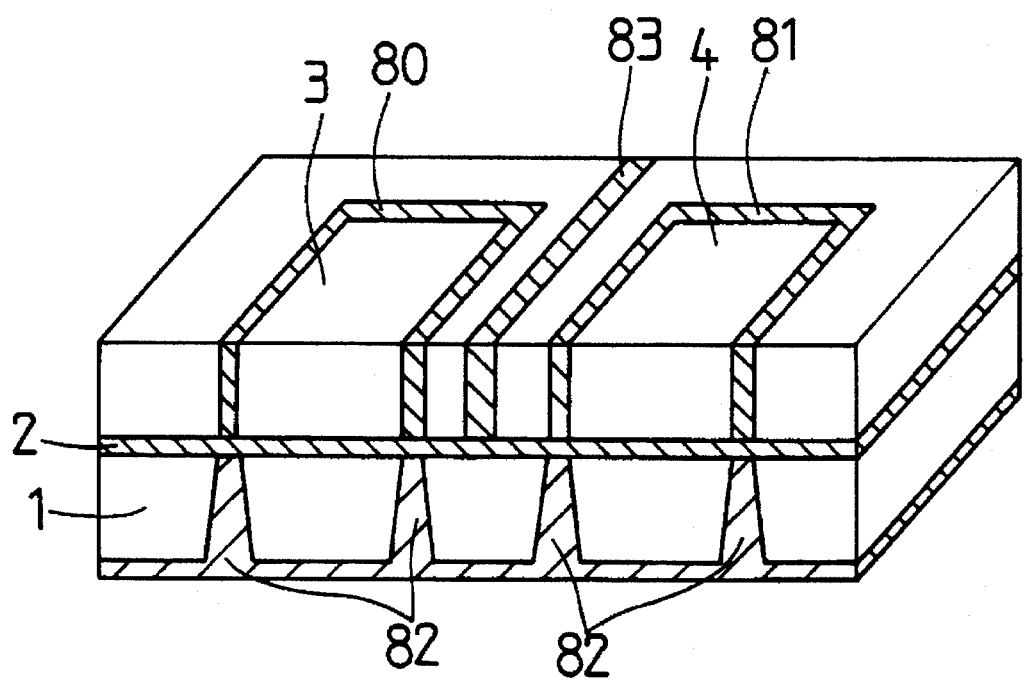
FIG. 8 is a schematic perspective view showing a configuration of an isolation layer according to a seventh embodiment of the present invention.

Alternatively, the insulation layers may be configured as shown in FIG. 8. Specifically, trenches (or V-shaped grooves) 82 filled by dielectric are formed from the rear side of the substrate 1 toward the positions of electrical isolation layer and light reflecting layer 80, 81 of respective elements to provide isolation in the substrate 1. The trenches 82 are formed in the same shape as the second insulation layers 80 and 81 in positional alignment thereto. They will be ineffective if they are positioned inside the element regions. Since such trenches 82 will be substantially deep, the V-shaped structure is obtained using etchant such as KOH capable of rapid etching. Electrical isolation is then provided by filling the groove portions thus formed with dielectric such as polyimide and low melting point glass. This makes it possible to improve voltage withstand characteristics between the elements. The width of the bottom of the trench 82, i.e., the portion of the trench in contact with the first insulation layer, is preferably equal to or greater than the width of the second insulation layer. The reason is because the thicker the dielectric portion, the higher the withstand voltage characteristics. Therefore, when such trenches 82 are provided, the thickness of the first insulation layers 2 may be reduced.

Referring to FIG. 8, when the second insulation layers in the semiconductor single crystal region has a single layer structure, it is preferable to provide another insulation layer 83 between the light emitting and light receiving elements to set the withstand voltage characteristics of the region substantially equal to those of the substrate 1. Although not shown, the same effect can be achieved by making the upper second insulation layer in a double structure as shown in FIG. 6B. Alternatively, an additional V-shaped groove 82 on the rear side of the substrate may be provided in a position between the light emitting and light receiving elements (under the area indicated by 83 in FIG. 8) to improve withstand voltage characteristics, although not shown.

In the configurations of the embodiments shown in FIG. 6A, FIG. 6B, FIG. 7, and FIG. 8, a plurality of photocouplers may be formed on the same substrate so that they bidirectionally operate as both input and output ends. This makes it possible to extend the application of the present invention to fields such as bidirectional optical communication. Although FIG. 2A, FIG. 2B, and FIG. 4 show a configurations wherein surface emission type light emitting elements are connected through optical waveguides, it is needless to say that the same effects can be extended to endface emission type light emitting elements. In this specification, "a pair of light emitting and light receiving diode" means a pair of one or more light emitting elements and one or more light receiving elements which are connected by an optical waveguide.

An eighth embodiment of the present invention will now be described.

Figure 9:
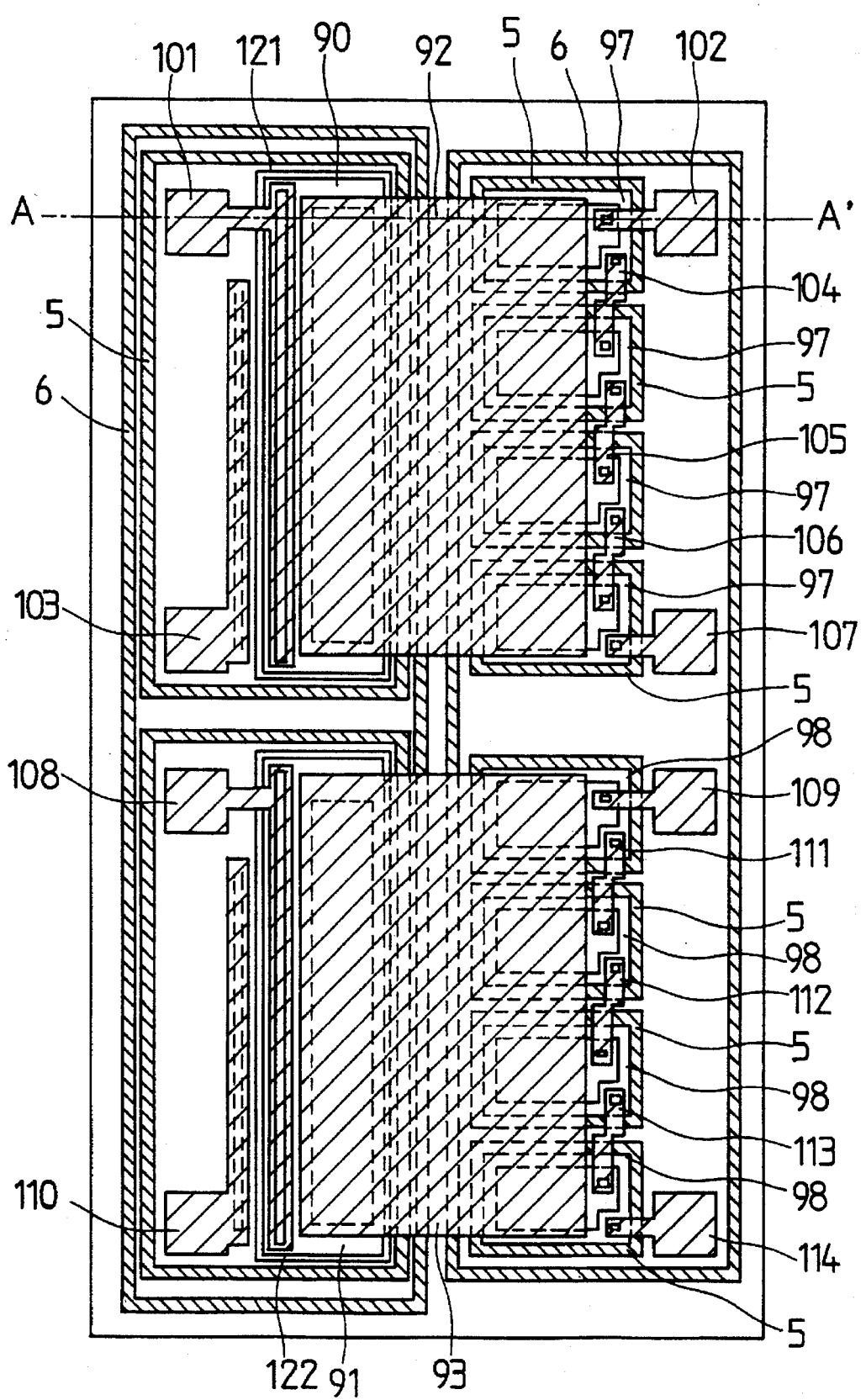
FIG. 9 is a schematic plan view showing a configuration of an eighth embodiment of the present invention.
Figure 10:
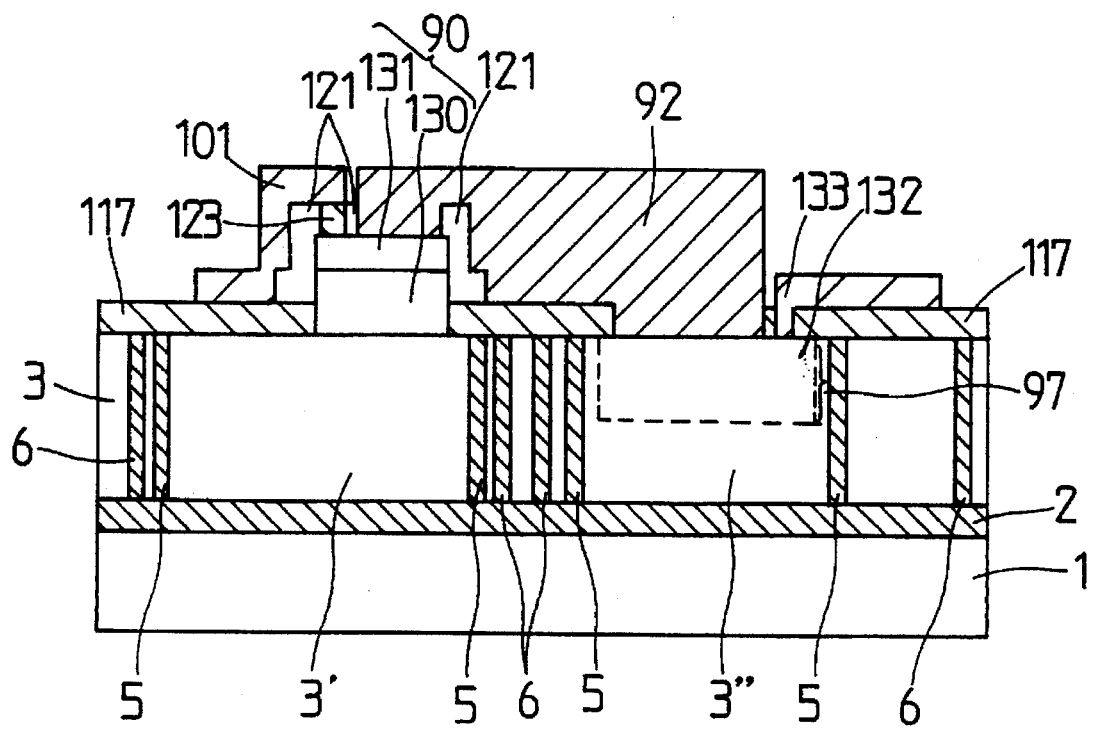
FIG. 10 is a schematic sectional view taken along the line A-A' in FIG. 9.

FIG. 9 is a plan view showing a photocoupler integrated circuit according to an eighth embodiment of the present invention. FIG. 10 is a sectional view taken along the line A–A' in FIG. 9. This embodiment has a configuration wherein four photoelectromotive force elements are connected to a single light emitting element in series. Specifically, four-stage series connection is made such that, for example, the output of the first stage is connected to the input of the second stage through connection electrodes 104, 105, and 106. This increases the photoelectromotive force on an additive basis, thereby providing a high voltage. FIG. 9 shows a configuration wherein two 1:4 photocoupler channels are formed. The elements are isolated from each other by electrical isolation layers 6 and light reflecting layers 5. Further, as shown in the sectional view in FIG. 10, each light emitting element is constituted by s GaAs LED 90 as in the prior art, and each light receiving element is provided as a photoelectromotive force element 97 which is obtained by forming an n-Si semiconductor single crystal region 3", forming a p-Si island region 132 in the region 3" and bonding an electrode 133 thereto (other electrodes are as shown in FIG. 9). An optical waveguide 92 is provided so that it covers the a SiO₂ insulation film 117 across the upper side of the GaAs LED's 90 and the top of the bonding portion of the photoelectromotive force elements 97. A Si₃N₄ intermediate insulation layer 121 is formed around the GaAs LED's 90 to protect them. The contact portion of a current injection electrode 101 is made of a metal material (gold-zinc alloy) 123 for connection.

As described above, it is not necessary to configure the elements of a photocoupler in a 1:1 relationship. In the configuration as described above, optical waveguides 92 and 93 are connected in parallel to photoelectromotive force elements 97 and 98, respectively. Therefore, the same amount of light is introduced into the photoelectromotive force elements 97 and 98 to provide them with substantially the same photoelectromotive force which is four times that of a single photoelectromotive force element. Of course, the number of the photoelectromotive force elements may be changed as needed. Since this configuration allows a high degree of integration, a number of such elements can be easily formed to provide a photocell utilizing a photoelectromotive force. Further, if an optical waveguide is continuously extended from a single light emitting element to a plurality of light receiving elements as in the present embodiment, the light receiving elements can be driven with high efficiency.

A ninth embodiment of the present invention will now be described.

Figure 12:
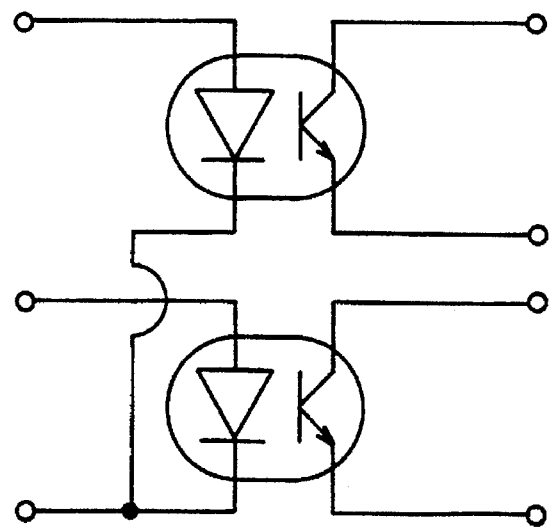
FIG. 12 is an equivalent circuit diagram for the ninth embodiment.
Figure 11A:
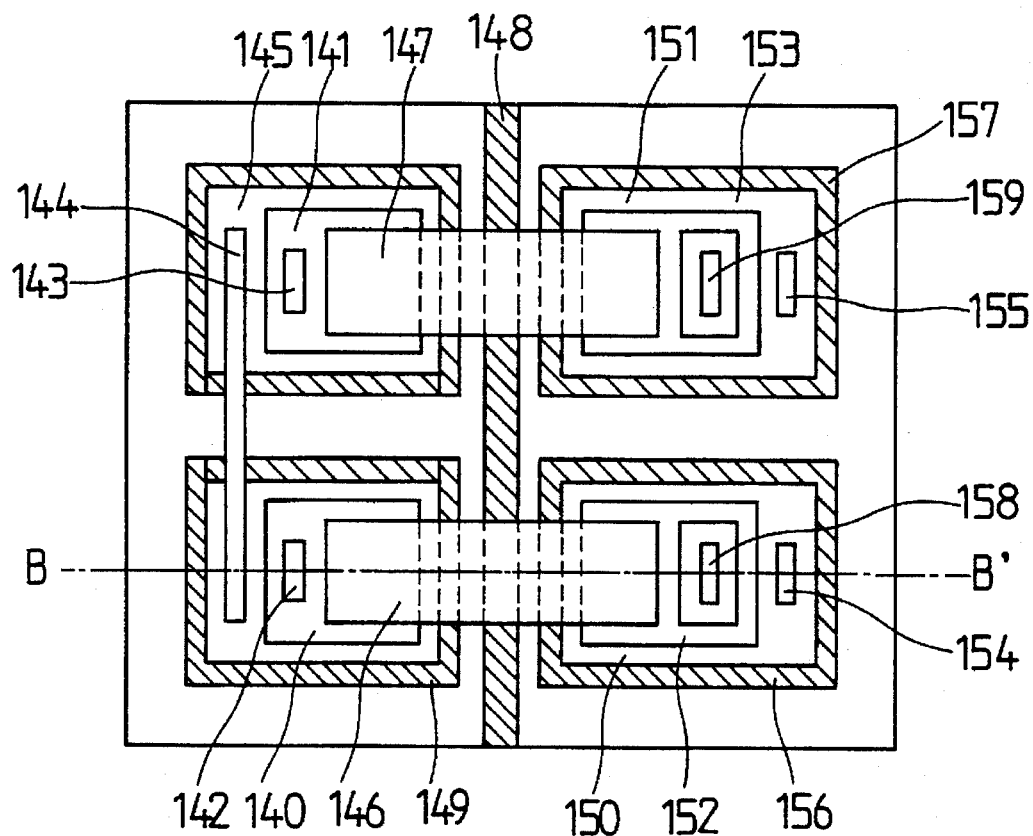
FIG. 11A is a schematic plan view showing a configuration of a ninth embodiment of the present invention.
Figure 11B:
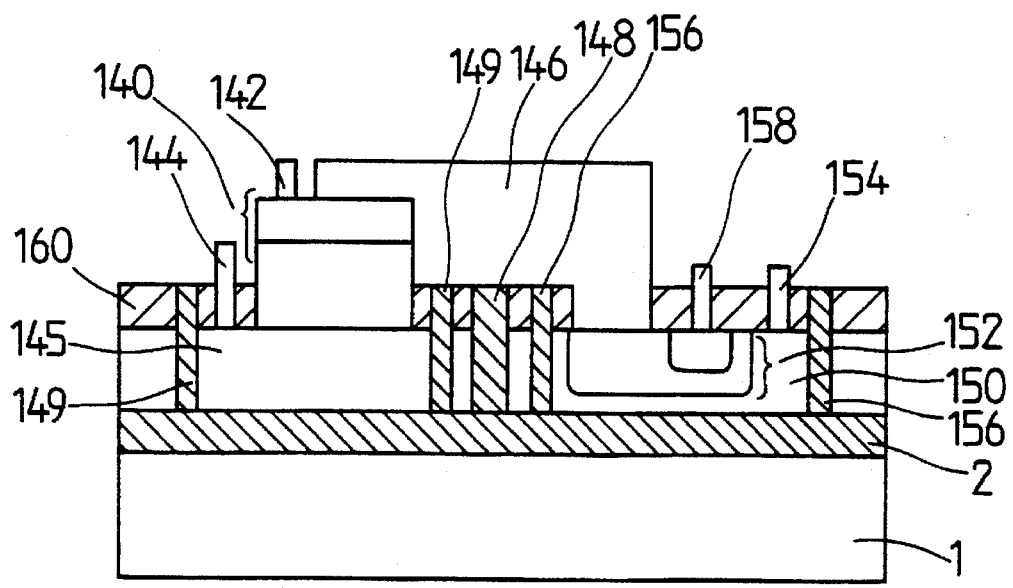
FIG. 11B a sectional view taken along the line B-B' in FIG. 11A.

FIG. 11A and FIG. 11B show a photocoupler according to a ninth embodiment of the present invention. FIG. 11A is a schematic plan view of the same, and FIG. 11B is a schematic sectional view taken along the line B–B' in FIG. 11A showing one of the channels. The configurations of GaAs LED 140 and 141 as light emitting elements and phototransistors 152 and 153 as light receiving elements are similar to those in the above-described embodiments and therefore will not be described. This ninth embodiment differs from the configuration in the second embodiment wherein the phototransistors have a common collector in that the phototransistors 152 and 153 are surrounded by respective optical isolation layers 156 and 157 to be electrically and optically isolated from each other. Therefore, the equivalent circuit for this embodiment is as shown in FIG. 12. The potentials at collectors 154 and 155 of the phototransistors 152 and 153, respectively can be independently selected.

The GaAs LED's 140 and 141 as light emitting elements share a ground electrode 144, and optical isolation is provided between them as a crosstalk preventing means so that the gap between them is at least about 30 μm which is the attenuation length. They are each surrounded by a light reflecting layer 149 which also functions as an electrical isolation layer. A trench hole 148 is provided in the semiconductor single crystal region between the light emitting and light receiving elements to perform electrical isolation and the reflection of light between them. This configuration also allows double isolation between the elements providing the same advantages as in other embodiments.

A tenth embodiment of the present invention will now be described.

Figure 13A:
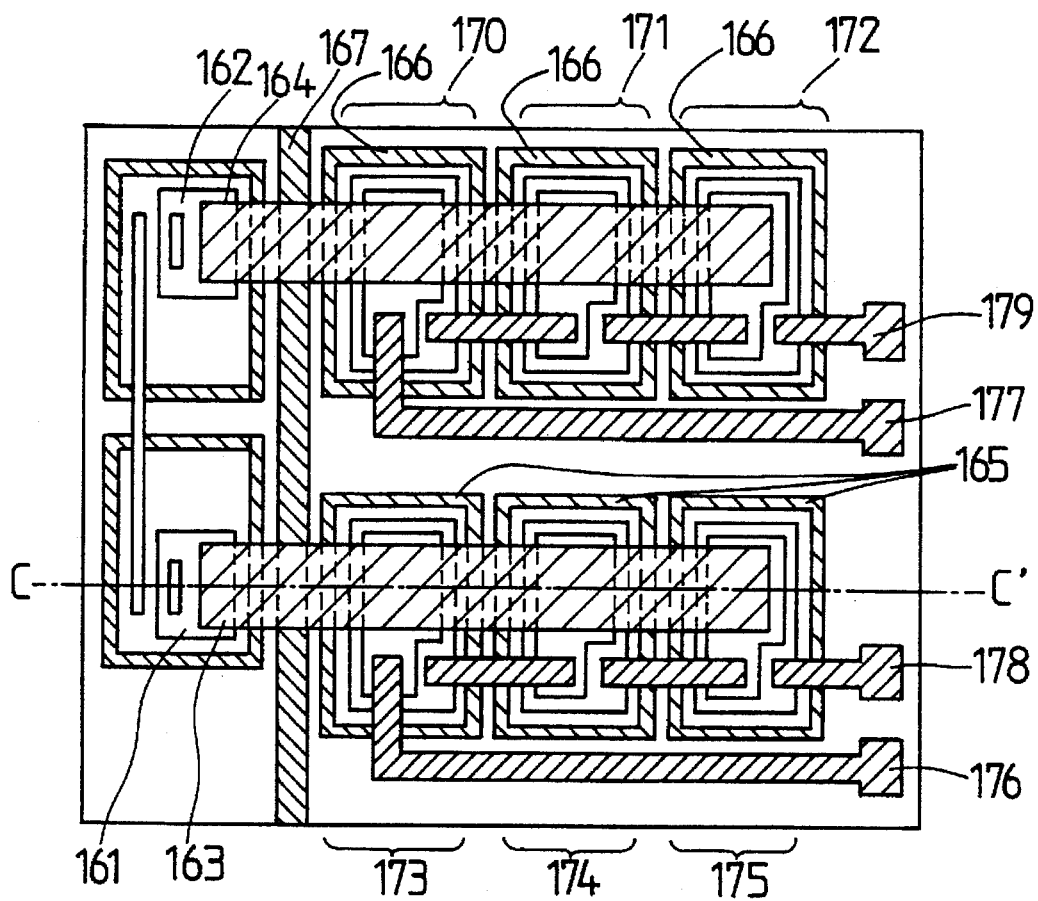
FIG. 13A is a schematic plan view showing a configuration of a tenth embodiment of the present invention.
Figure 13B:
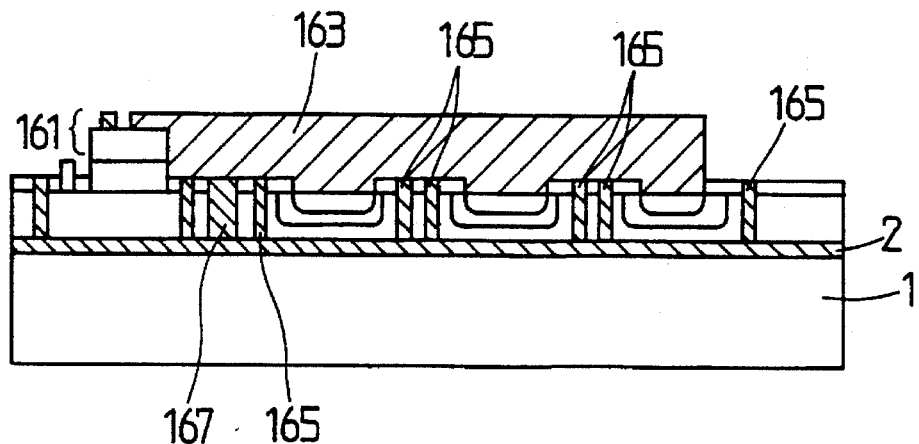
FIG. 13B is a sectional view taken along the line C-C' in FIG. 13A.

FIG. 13A and FIG. 13B show a photocoupler according to a tenth embodiment of the present invention. FIG. 13A is a plan view of the same, and FIG. 13B is a sectional view taken along the line C–C' in FIG. 13A. This embodiment uses photoelectromotive force elements 170, 171, 172, 173, 174, and 175 formed by p-n junctions of silicon as the light receiving element. The light emitting elements have the same configuration as those in the third and ninth embodiments. They share a common ground electrode and are spaced apart from each other by at least about 30 μm which is the attenuation length. Although these photoelectromotive force elements can be individually used as a light receiving element, according to the present embodiment, a group constituted by the elements 170, 171, and 172 and a group constituted by the elements 173, 174, and 175 are each connected in series in a linear arrangement and are coupled in series to optical waveguides 26 and 27, respectively. 176 and 177 represent positive output terminal, and 178 and 179 represent negative output terminals.

Figure 14:
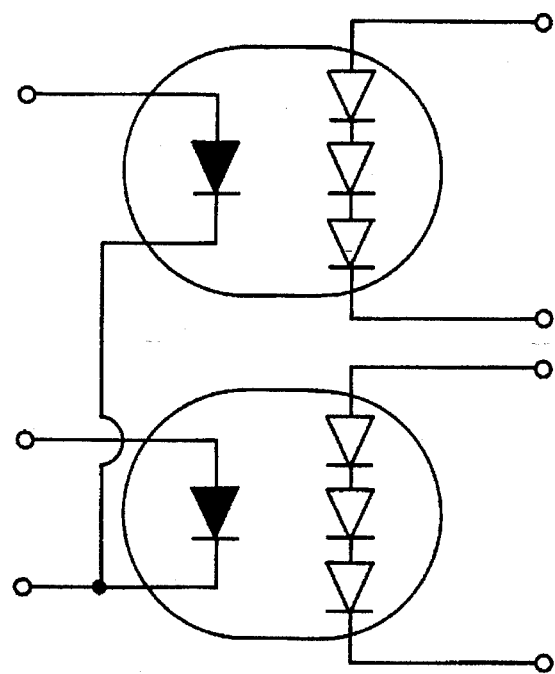
FIG. 14 is an valent circuit diagram for the tenth embodiment.

The light emitted by light emitting elements 161 and 162 is repeatedly reflected in optical waveguides 163 and 164, respectively, and are finally absorbed by the respective groups constituted by three photodiodes. Since each other the photodiodes 170 through 175 is isolated by isolation grooves 165 and 166, it is possible to accumulate the photoelectromotive force. An equivalent circuit for this configuration is shown in FIG. 14. The present embodiment also makes it possible to integrate a multiplicity of photo-electromotive force elements against one light emitting element on a single chip.

An eleventh embodiment of the present invention will now be described.

Figure 15A:
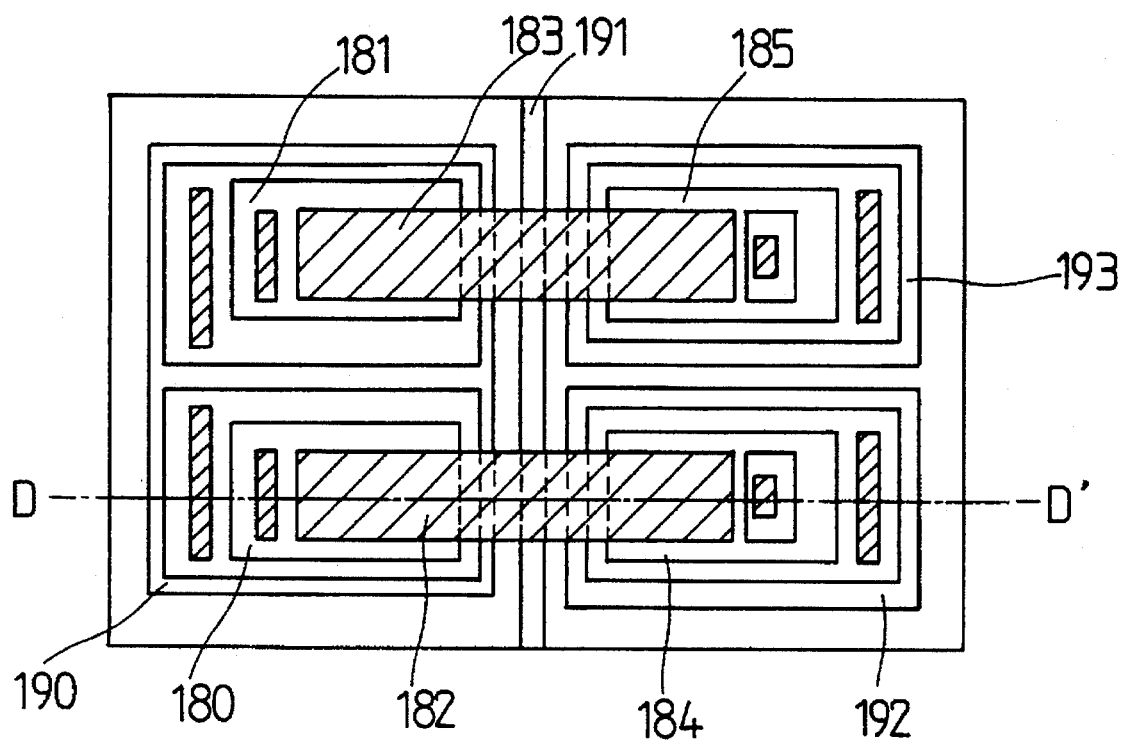
FIG. 15A is a schematic plan view showing a configuration of a eleventh embodiment of the present invention.
Figure 15B:
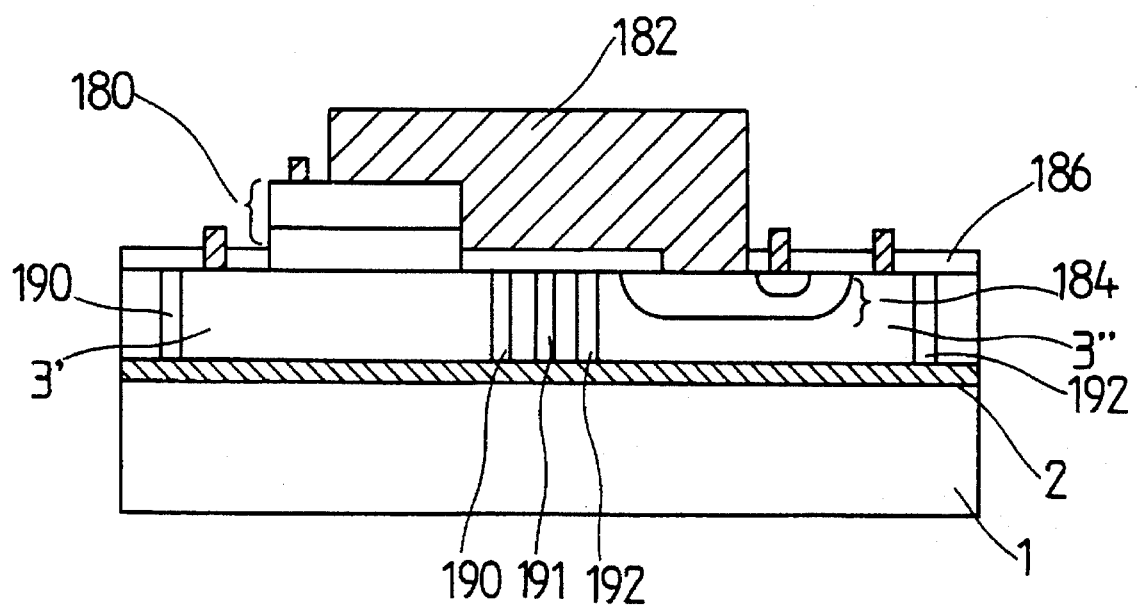
FIG. 15B is a sectional view taken along the line D-D' in FIG. 5A.

FIG. 15A and FIG. 15B show a photocoupler according to an eleventh embodiment of the present invention. FIG. 15A is a plan view of the same, and FIG. 15B is a sectional view taken along the line D–D' in FIG. 15A. In the third, ninth, and tenth embodiments, isolation grooves (trenches) are provided between light emitting and light receiving elements and $SiO_2$ layers are formed in the grooves as an insulator having a low refractive index in order to isolate those elements from each other. In this embodiment, the same effect can be obtained by leaving the isolation grooves as an insulation layer portion unfilled. When isolation grooves 190, 191, 192, and 193 are formed, if the width of the grooves us too small, cavities can remain therein because the oxidizer ($H_2O$, $O_2$, etc.) for forming oxide films 186 do not sufficiently penetrate into the grooves. In such a case, even if recesses are produced by such cavities, there will be no problem as described below as long as they do not adversely affect the formation of optical waveguides thereabove.

Specifically, since the refractive index of the air or vacuum is 1, the light which has been propagated from light emitting diodes 180 and 181 to an n-type single crystal silicon layer 3' is partially subjected to total reflection at the interface between the layer and the isolation groove 190 (and an SOI isolation layer 2 as shown in FIG. 15B). As a result, optical isolation can be provided simultaneously with electrical isolation. Therefore, it is possible to use a configuration wherein only the isolation grooves 190 through 193 are formed. However, it is preferable to format least an oxide film on the surface of each isolation groove because, otherwise, there is a possibility that shorting occurs due to some reason before an oxide film 186 for protecting the substrate surface. The advantage of leaving the cavities unfilled is that the filling process can be omitted. Therefore, optical waveguides 182 and 183 can be formed directly above the isolation grooves 190 through 193 without problem. The plan view in FIG. 15A shows the isolation grooves 190 through 193 only for the purpose of explanation. In practice, their surfaces are covered by a substantially transparent oxide film 186 and are not directly exposed, although visible.

A twelfth embodiment of the present invention will now be described.

Figure 16A:
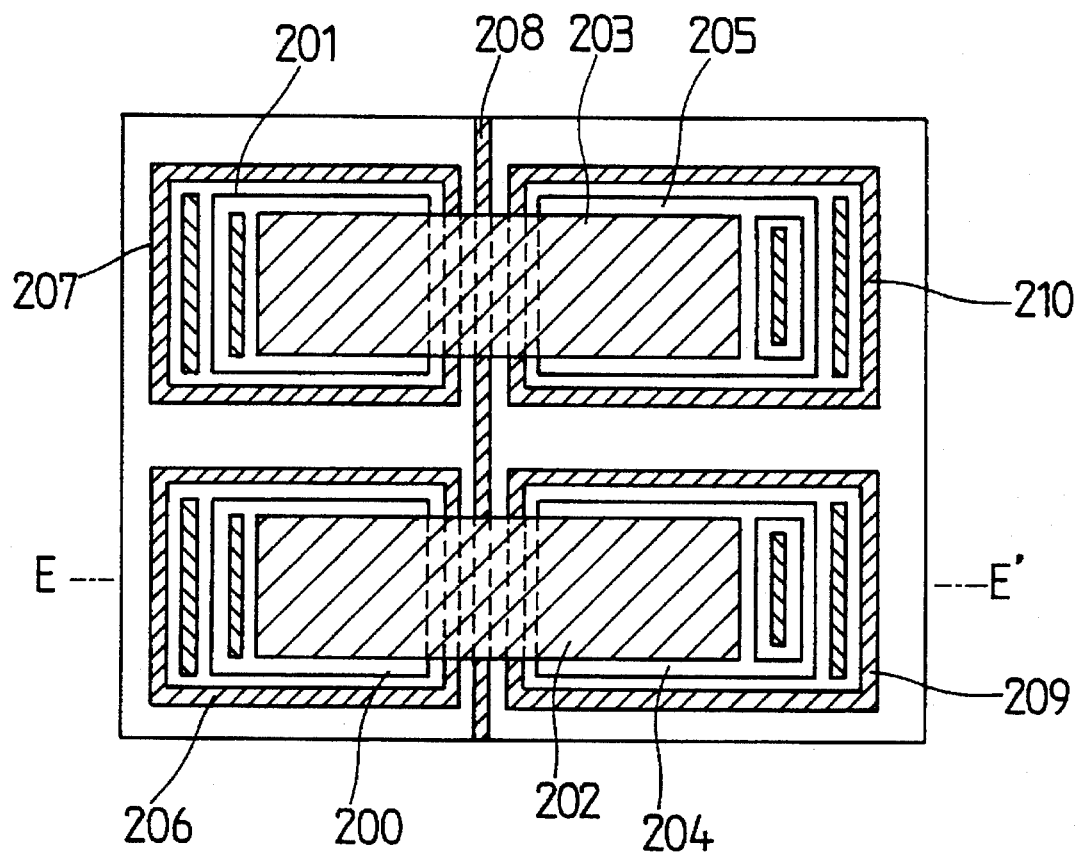
FIG. 16A is a schematic plan view showing a configuration of a twelfth embodiment of the present invention.
Figure 16B:
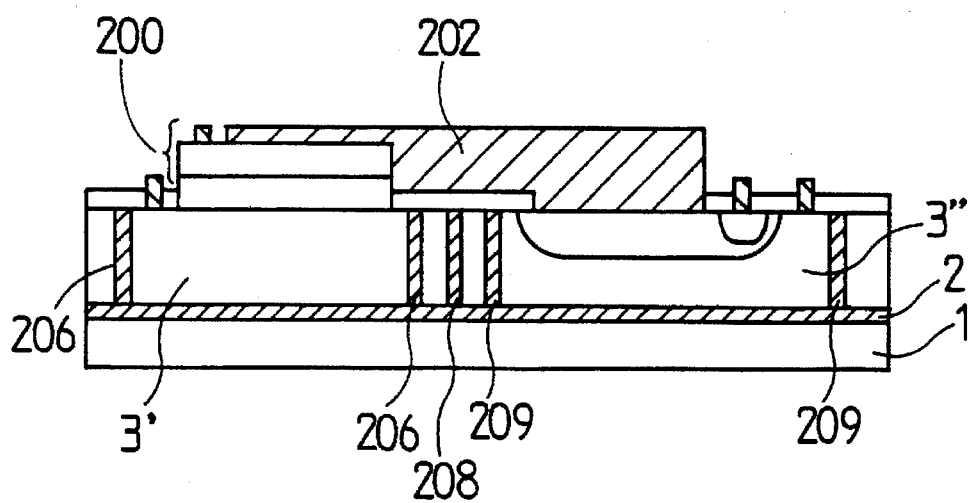
FIG. 16B is a sectional view taken along the line E-E' in FIG. 16A.

FIG. 16A and FIG. 16B show a photocoupler according to an twelfth embodiment of the present invention. FIG. 16A is a plan view of the same, and FIG. 16B is a sectional view taken along the line E–E' in FIG. 16A. It has a configuration wherein isolation grooves 206, 207, 208, 209, and 210 are provided around GaAs light emitting diodes 200 and 201 in addition to the structure shown in FIG. 15A and FIG. 15B. Thus, all the elements are isolated from each other; the light emitted from the adjoining GaAs LED's 200 and 201 is prevented from going around; and the input elements are also reliably isolated. In this configuration, therefore, each channel is completely independent. Although the isolation grooves 206 through 210 are filled by $SiO_2$ insulation layers in the figures, an unfilled structure as shown in FIG. 15A and FIG. 15B (eleventh embodiment) may be employed. The present embodiment has a configuration similar to those in the above-described embodiments wherein the light emitting and light receiving elements are both isolated from the substrate for reliable withstand voltage characteristics. 202 and 203 represent optical waveguides.

A thirteenth embodiment of the present invention will now be described.

Figure 17A:
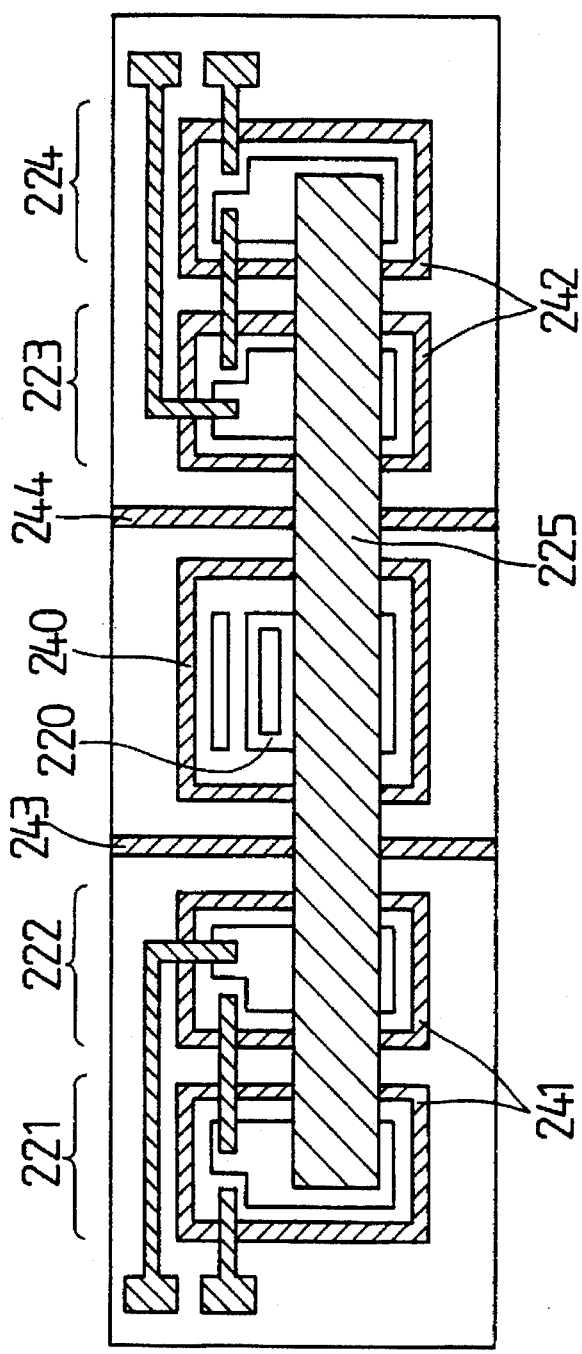
FIG. 17A is a schematic plan view showing a configuration of a thirteenth embodiment of the present invention.
Figure 17B:
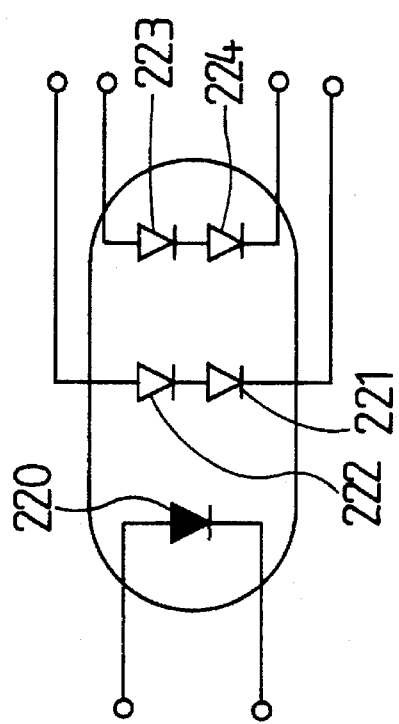
FIG. 17B is an equivalent circuit diagram for the thirteenth embodiment.

FIG. 17A is a schematic view showing a configuration wherein an optical waveguide 225 extends to the left and right to form a pair of light emitting and light receiving elements constituted by a single light emitting element and two pairs of light receiving elements (four light receiving elements in total, i.e., the pair constituted by elements 221 and 222 and the pair constituted by elements 223 and 224). FIG. 17B shows an equivalent circuit diagram for this configuration. In this case, the light emitted by a light emitting element 220 in the middle is also propagated by the optical waveguide 225 in two directions to each pair of light emitting and light receiving elements. Those elements are surrounded by respective insulation layers 240, 241, and 242, and the light emitting element and the pairs of light receiving elements are isolated respectively by electrical isolation layers 243 and 244 to improve withstand voltage characteristics. Each of the two pairs of light receiving elements is series-connected in a 1:2 relationship similar to that shown in FIG. 13A. It goes without saying the each of the light receiving elements can be individually used. If needed, the optical waveguide may extend at right angles. The greater the number of coupled light receiving element, the more the dispersion of the light. It is however possible to employ a configuration wherein the optical waveguide extends from the light emitting element in three directions perpendicular to each other (not shown). Incidentally, insulation layers 241, 242 serves as a light reflection layers.

A fourteenth embodiment of the present invention will now be described.

Figure 18:
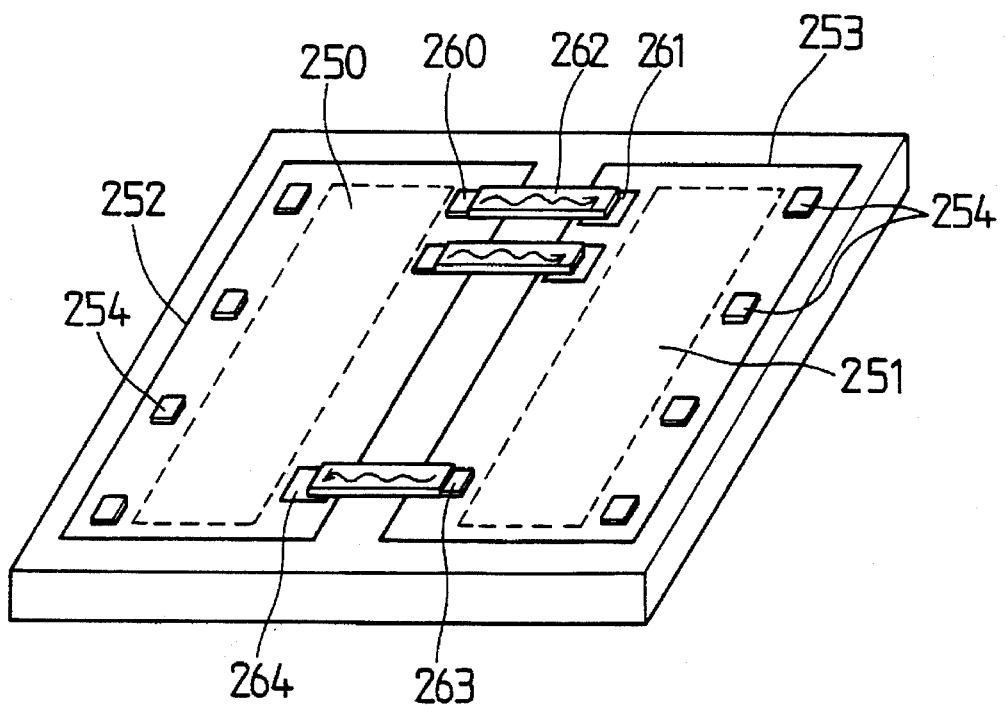
FIG. 18 is a schematic perspective view showing a configuration wherein photocouplers and peripheral circuits are integrated into a single chip according to a fourteenth embodiment of the present invention.

FIG. 18 is a schematic outside view showing integration of photocouplers and associated peripheral circuits into a single chip as an example wherein integration provides the highest added value. Peripheral circuits 250 and 251 are isolated from the outside and from the substrate by electrical isolation films 252 and 253, respectively. They have an isolated contact electrode 254 therein. Photocouplers are formed to from the side of the circuit 250 to the side of the circuit 251. Specifically, light emitting element 260 is provided on the side of the circuit 250; light receiving element 261 is provided on the side of the circuit 251; and an optical waveguide 262 is formed therebetween. FIG. 18 shows another similar channel is in parallel.

Similarly, a photocoupler channel (a light emitting element 263 and a light receiving element 264) is provided from the side of the circuit 251 to the side of the circuit 250. This configuration allows bidirectional signal transmission between the circuits 250 and 251. Although FIG. 18 shows two channels in one direction and one channel in the other direction, the channels may be formed in any quantity required in both directions because each photocoupler channel can be independently integrated.

As apparent from the above-described embodiments, the present invention provides crosstalk preventing means between plural sets of light emitting and light receiving elements formed on the same substrate. It is therefore possible to form a monolithic multi-channel photocoupler, a photocoupler integral with peripheral circuits, and a monolithic bidirectional photocoupler. The present invention can be applied to parallel electrical insulation between multiple channels in noisy environments such as in applications for factory automation.

The many features and advantages of the present invention are apparent from the description and thus it is intended by the appended claims to cover all such features and advantages of the invention. Further, since numerous modifications and changes will readily occur to those skilled in the art, it is nor desired to limit the invention to the above embodiments described above. Hence, all suitable modifications and equivalents may be resorted to as falling within the scope of the invention.

What is claimed is:

1. A semiconductor device comprising:
   a substrate;
   a semiconductor single crystal region constituted by a single crystal semiconductor formed on said substrate;
   a plurality of channels formed on said semiconductor single crystal region, each of said plurality of channels comprising:
   a light emitting element for emitting light in response to an input electrical signal,
   a light receiving element for receiving light emitted by said light emitting element and for outputting an output electrical signal, and
   an optical waveguide formed across said light emitting element and said light receiving element for optically coupling said light emitting element and said light receiving element; and
   a crosstalk preventing structure disposed to prevent crosstalk between said plurality of channels by reflecting and absorbing light emitted by said light emitting element constituting a particular one of said plurality of channels that is directed to another one of said plurality of channels adjacent to said particular one of said plurality of channels, said crosstalk preventing structure comprising:
   a first portion of at least one of an insulator and a dielectric disposed in said semiconductor single crystal region between said plurality of channels,
   a second portion of at least one of an insulator and a dielectric disposed in said semiconductor single crystal region between said plurality of channels, and
   a third portion of a semiconductor substance disposed between said first portion and second portion,
   said first portion and said second portion reflecting light,
   said third portion absorbing light which passes at least one of said first portion and said second portion.

2. A semiconductor device according to claim 1, wherein:
   each of said first portion and said second portion of said crosstalk preventing structure comprises a light reflecting layer having a first refractive index smaller than a second refractive index of said semiconductor single crystal region.

3. A semiconductor device according to claim 1, further comprising:
   an electrical isolation layer disposed in said semiconductor single crystal region between said light emitting element and said light receiving element in each of said plurality of channels, said electrical isolation layer being formed of at least one of an insulator and a dielectric to electrically isolate said light emitting element from said light receiving element in each of said plurality of channels, said electrical isolation layer comprising:
   a first electrical isolation portion disposed between said light emitting element and said light receiving element of each of said plurality of channels, and
   a second electrical isolation portion disposed between said substrate and said semiconductor single crystal region,
   said first electrical isolation portion of said electrical isolation layer extending from a surface of said semiconductor single crystal region to said second electrical isolation portion of said electrical isolation layer.

4. A semiconductor device according to claim 1, wherein said semiconductor single crystal region includes:
   a light emitting element area in which said light emitting element of each of said plurality of channels are formed;
   a light receiving element area in which said light receiving element of each of said plurality of channels are formed; and
   an electrical isolation portion comprising a plurality of electrical isolation films surrounding said light emitting element area and said light receiving element area, respectively.

5. A semiconductor device according to claim 4, further comprising:
   a filler area having a first thermal expansion coefficient close to or substantially the same as a second thermal expansion coefficient of said semiconductor single crystal region, said filler area being located between said plurality of electrical isolation films.

6. A semiconductor device according to claim 1, wherein:
   said optical waveguide is made of a transparent material having a refractive index greater than one against a wavelength of the light emitted by said respective light emitting elements of said plurality of channels.

7. A semiconductor device according to claim 1, wherein:
   said semiconductor single crystal region is made of silicon; and
   said light emitting element is a gallium arsenide (GaAs) light emitting diode formed on said silicon with a heterojunction.

8. A semiconductor device according to claim 1, wherein:
   said semiconductor single crystal region is made of silicon; and
   said light emitting element is selected from an element of a phototransistor, a photodiode, a photo-thyristor, a photo-triac and a photoelectromotive force element, all of which utilize silicon (Si).

9. A semiconductor device according to claim 2, wherein:
   said light reflecting layer is made of a material selected from the group of silicon oxide ($SiO_2$), silica glass, and an air gap.

10. A semiconductor device according to claim 1, wherein:
    said optical waveguide is made of a film, a material of said film being selected from the group of silicon nitride ($Si_3N_4$), titanium oxide ($TiO_2$), and arsenic glass ($As_2Se_3$, $As_2S_3$).

11. A semiconductor device according to claim 4, wherein:

said plurality of electrical isolation films are made of at least one of silicon oxide (SiO$_2$) and silica glass.

12. A semiconductor device comprising:

a substrate;

a plurality of light emitting element regions and a plurality of light receiving element regions, said plurality of light emitting element regions and said plurality of light receiving element regions being semiconductor element regions formed of a single crystal semiconductor substance and being located on said substrate;

a plurality of light emitting elements corresponding respectively to said plurality of light emitting element regions;

a plurality of light receiving elements corresponding respectively to said plurality of light receiving element regions;

a plurality of optical waveguides, each of which optically couple a respective one of said plurality of light emitting elements and a respective one of said plurality of light receiving elements; and an isolation region provided for every one of said plurality of light emitting element regions as well as for every one of said plurality of light receiving element regions, said isolation region comprising:

a first insulation film surrounding sides of each of said plurality of light emitting element region and said plurality of light receiving element regions, a second insulation film disposed under each of said plurality of light emitting element regions and said plurality of light receiving element regions, and a semiconductor wall disposed around each of said plurality of light emitting element regions and said plurality of light receiving element regions with said first insulating film interposed therebetween, said first insulation film communicating with said second insulation film, said first insulation film, said second insulation film, and said semiconductor wall collectively forming an electrical and optical isolation between each of said plurality of light emitting element regions and each of said plurality of light receiving element regions by reflecting and absorbing light passing through a portion other than said optical waveguides.

13. A semiconductor device comprising:

a substrate;

a first single crystal semiconductor region in which a first light emitting element is formed, disposed on said substrate;

a second single crystal semiconductor region in which a second light emitting element is formed, disposed on said substrate;

a third single crystal semiconductor region in which a first light receiving element is formed, disposed on said substrate;

a fourth single crystal semiconductor region in which a second light receiving element is formed, disposed on said substrate;

a first optical waveguide optically coupling said first light emitting element and said first light receiving element;

a second optical waveguide optically coupling said second light emitting element and said second light receiving element;

a first isolation region of an insulation substance having a first refractive index smaller than a second refractive index of said first single crystal semiconductor region, said first isolation region enclosing said first single crystal semiconductor region at sides and bottom thereof;

a second isolation region of said insulation substance having a third refractive index smaller than a fourth refractive index of said second single crystal semiconductor region, said second isolation region enclosing said second single crystal semiconductor region at sides and bottom thereof;

a third isolation region of an insulation substance having a fifth refractive index smaller than a sixth refractive index of said third single crystal semiconductor region, said third isolation region enclosing said third single crystal semiconductor region at sides and bottom thereof; and a fourth isolation region of an insulation substance having a seventh refractive index smaller than a eighth refractive index of said fourth single crystal semiconductor region, said fourth isolation region enclosing said fourth single crystal semiconductor region at sides and bottom thereof;

at least said first single crystal semiconductor region and said second single crystal semiconductor region being further surrounded at sides thereof by semiconductor portions, respectively, to absorb light coming out through said first isolation region and said second isolation region to said semiconductor portions.

14. A semiconductor device according to claim 13, wherein:

said first single crystal semiconductor region and said second single crystal semiconductor region are provided within a first semiconductor island provided on said substrate;

said third single crystal semiconductor region and said fourth single crystal semiconductor region are provided within a second semiconductor island provided on said substrate; and wherein said semiconductor device further comprises an electrical isolation region disposed between said first semiconductor island and said second semiconductor island.

15. A semiconductor device according to claim 14, wherein:

said first semiconductor island and said second semiconductor island are electrically isolated from said substrate.

* * * * *